(12) United States Patent
Giannacopoulos et al.

(10) Patent No.: US 10,394,978 B2
(45) Date of Patent: Aug. 27, 2019

(54) FINITE ELEMENT METHODS AND SYSTEMS

(71) Applicant: The Royal Institution for the Advancement of Learning / McGill University, Montreal (CA)

(72) Inventors: Dennis Giannacopoulos, Westmount (CA); Yousef El Kurdi, Brossard (CA); Warren Gross, Montreal (CA)

(73) Assignee: THE ROYAL INSTITUTION FOR THE ADVANCEMENT OF LEARNING / MCGILL UNIVERSITY, Montreal (CA)

( * ) Notice: Subject to any disclaimer, the term of this patent is extended or adjusted under 35 U.S.C. 154(b) by 1009 days.

(21) Appl. No.: 14/526,651

(22) Filed: Oct. 29, 2014

(65) Prior Publication Data

US 2015/0120261 A1   Apr. 30, 2015

Related U.S. Application Data

(60) Provisional application No. 61/896,675, filed on Oct. 29, 2013.

(51) Int. Cl.
*G01V 13/00* (2006.01)
*G06F 17/50* (2006.01)

(52) U.S. Cl.
CPC ................... *G06F 17/5018* (2013.01)

(58) Field of Classification Search
None
See application file for complete search history.

(56) References Cited

U.S. PATENT DOCUMENTS

| | | | | |
|---|---|---|---|---|
| 2004/0234113 | A1* | 11/2004 | Miga | G06T 7/0012 382/128 |
| 2008/0088578 | A1* | 4/2008 | Ikits | G09B 23/32 345/156 |
| 2009/0259329 | A1* | 10/2009 | Patnala | G06F 17/5018 700/98 |

OTHER PUBLICATIONS

Yousef El-Kurdi et al. "Efficient Implementation of Gaussian Belief Propagation Solver for Large Sparse Diagonally Dominant Linear Systems", IEEE Transactions on Magnetics, vol. 48, No. 2, Feb. 2012, pp. 471-474.*

(Continued)

*Primary Examiner* — Timothy A Mudrick
*Assistant Examiner* — Abdou K Seye
(74) *Attorney, Agent, or Firm* — Norton Rose Fulbright Canada LLP

(57) ABSTRACT

Herein provided are methods and systems for generating finite element modelling results. Finite element method (FEM) data relating to establish a FEM problem to be solved for a portion of a physical system being analyzed is received. A FEM mesh comprising at least FEM mesh node locations relating to the portion of the physical system is generated. FEM mesh values for each FEM mesh node location are automatically generated with a microprocessor. A factor graph model comprising a plurality of random variable nodes and a plurality of factor nodes is automatically generated with a microprocessor based upon the FEM mesh node locations. A set of belief propagation update rules are automatically executed upon the factor graph model using Gaussian function parametrization and the FEM mesh values. The belief propagation update rules are iteratively executed until a predetermined condition has been met.

16 Claims, 12 Drawing Sheets

(56) References Cited

OTHER PUBLICATIONS

Danny Bickson, "Gaussian Belief Propagation: Theory and Application", Jul. 12, 2009, pp. 1-110.*

Ori Shental et al. "Gaussian Belief Propagation Solver for Systems of Linear Equations", IEEE 2008, pp. 1863-1867.*

Imre Kiss et al. "High locality and increased intra-node parallelism for solving finite element models on GPUs by novel element-by-element implementation",978-1-4673-1576-0/12/$31.00 © 2012 IEEE, pp. 1-5.*

J. Pearl, Probabilistic Reasoning in Intelligent Systems: Networks of Plausible Inference. Morgan Kaufmann, 1988.

Shental, P. Siegel, J. Wolf, D. Bickson, and D. Dolev, "Gaussian belief propagation solver for systems of linear equations," in IEEE Int. Symp. on Inform. Theory (ISIT), Jun.-Nov. 2008, pp. 1863-1867.

Y. Weiss and W. T. Freeman, "Correctness of belief propagation in Gaussian graphical models of arbitrary topology," Neural Computation, vol. 13, No. 10, pp. 2173-2200, 2001.

Y. El-Kurdi, W. Gross, and D. Giannacopoulos, "Efficient implementation of Gaussian belief propagation solver for large sparse diagonally dominant linear systems," IEEE Trans. Magn., vol. 48, No. 2, pp. 471-474, 2012.

Y. El-Kurdi, D. Giannacopoulos, and W. Gross, "Relaxed gaussian belief propagation," in IEEE Int. Symp. on Inform. Theory (ISIT), Jul. 2012, pp. 2002-2006.

Y. El-Kurdi, W. Gross, and D. Giannacopoulos, "Parallel solution of the finite element method using Gaussian belief propagation," in The 15th Biennial IEEE Conference on Electromagnetic Field Computation, 2012, p. 141.

Y. El-Kurdi, W. Gross, and D. Giannacopoulos, "Parallel Multi-Grid Acceleration for the Finite Element Gaussian Belief Propagation Algorithm" (IEEE Trans. Magn., vol. 50, No. 2, pp. 581-584).

W. L. Briggs, V. E. Henson, and S. F. McCormick, A multigrid tutorial, 2nd ed. Philadelphia, PA, USA: SIAM, 2000.

* cited by examiner ns and embodiments of the invention will become apparent upon examination of the following description and examples:

FINITE ELEMENT METHODS AND SYSTEMS

CROSS-REFERENCE TO RELATED APPLICATIONS

This patent application claims the benefit of U.S. Provisional Patent Application U.S. 61/896,675 filed Oct. 29, 2013 entitled "Finite Element Methods and Systems", the entire contents of which are included by reference.

FIELD OF THE INVENTION

This invention relates to Finite Element Modelling (FEM) and more particularly to a FEM Multigrid Gaussian Belief Propagation (FMGaBP) via probabilistic inference with graphical models to expose distributed computations and remove global algebraic operations and sparse data-structures.

BACKGROUND OF THE INVENTION

Microprocessors, commonly referred to as processors, represent the central processing unit of a computer and were originally developed with only one core. Multicore processors were developed in the early 2000s and may have two cores, four cores, six cores, eight cores, ten cores, or more. A multicore processor implements multiprocessing in a single physical package and cores may be coupled tightly or loosely where cores may or may not share caches, may implement message passing or shared memory inter-core communication methods, etc. and are generally interconnected using bus, ring, two-dimensional mesh, and crossbar architectures. However, the improvement in performance gained by the use of a multicore processor depends on the software algorithms used and their implementation where possible gains are limited by the fraction of the software that can be run in parallel simultaneously on the multiple cores. In the best case, so-called embarrassingly parallel problems may realize speedup factors near the number of cores, or even more if the problem is split up enough to fit within each core's cache(s), avoiding use of much slower main system memory. Most applications, however, are not accelerated so much unless programmers invest a prohibitive amount of effort in re-factoring the whole problem.

Such an issue arises with Finite Element Method software performing finite element analysis (FEA) wherein mesh generation techniques divide a complex problem into small elements together with material properties and underlying physics such that the problem is reduced to solving a series of algebraic equations for steady state problems or ordinary differential equations for transient problems. However, conventional prior art FEM software relies upon performing global and sparse algebraic operations that severely limit its parallel performance. Within the prior art the efforts in re-factoring the problem have focused to improving the performance of conventional sparse computations at the expense of sophisticated programming techniques tailored to specific CPU hardware architectures, such as cache access optimizations, data-structures and code transformations such that code portability and reusability are limited. For example, implementations of Conjugate Gradient (CG) solvers for FEM problems require global sparse operations which perform at a low fraction of the peak CPU computational throughput. Further accelerating CG solvers on parallel architectures is communication limited thereby generating a subset of prior art attempting to improve the communication overhead of such sparse solvers through reformulation, namely communication reducing schemes, which typically suffer from numerical instability and limited support for pre-conditioners. These performance bottlenecks are even more pronounced in high accuracy FEM analysis as the increased number of elements yields a large number of unknowns, in the order of millions or more, which prevents FEM software users from productively utilizing parallel multicore high performance computing platforms.

Prior art generic and optimized FEM libraries such as deal.II, GetFEM++, and Trilinos whilst useable for sparse FEM computations; obtaining a sustained performance can be difficult due to the varying sparsity structure for different application areas. Further, such libraries do not help with the costly stage of assembling the sparse matrix from the generated elements. Whilst a matrix free (MF) approach to execute the sparse matrix-vector multiply (SMVM) kernel in the CG solver has been reported within the prior art and shows promising speedups, it does not depart from the sequential global algebraic setup of the CG solver and may only be efficient for high order elements.

Accordingly, it would be beneficial to reformulate the FEM problem such that the message passing issue is addressed rather than seeking solutions that avoid message passing and communications. Accordingly, the inventors have established a novel distributed FEM reformulation using belief propagation (BP) that eliminates the dependency on any sparse data-structures or algebraic operations; hence, attacking a (the ?) root-cause of the problem. Belief propagation, strictly the belief propagation algorithm, is a message passing algorithm based upon graphical models that efficiently compute the marginal distribution of each variable node by recursively sharing intermediate results. BP has demonstrated excellent empirical results in other applications, such as machine learning, channel decoding, and computer vision. A Gaussian BP algorithm proposed by Shentel et al. in "Gaussian Belief Propagation Solver for Systems of Linear Equations" (IEEE Int. Symp. on Inform. Theory (ISIT), 2008, pp. 1863-1867) operates as a parallel solver for a linear system of equations by modeling it as a pairwise graphical model. Whilst showing promise for highly parallel computations on diagonally dominant matrices the Gaussian BP does scale for large FEM matrices and also fails to converge for high order FEM problems. Significantly, such a solver still requires assembling a large sparse data-structure.

In contrast the Finite Element Gaussian Belief Propagation (FGaBP) algorithm and its multigrid variant, the FMGaBP algorithm introduced by the inventors are distributed reformulations of the FEM that result in highly efficient parallel implementations. The algorithms according to embodiments of the invention beneficially provide a highly parallel approach to processing the FEM problem, element-by-element, based on distributed message communications and localized computations. This provides an algorithm amicable to different parallel computing architectures such as multicore CPUs, manycore GPUs, and clusters of both.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to address limitations within the prior art relating to Finite Element Modelling (FEM) and more particularly to a FEM Multigrid Gaussian Belief Propagation (FMGaBP) via probabilistic inference with graphical models to expose distributed computations and to remove global algebraic operations and sparse data-structures.

In accordance with an embodiment of the invention there is provided a method of generating finite element modelling results comprising:

receiving finite element method (FEM) data relating to establishing a FEM problem to be solved for a portion of a physical system being analysed, the FEM data comprising physical dimensions of each element within the portion of the physical system, material data relating the materials forming each element within the portion of the physical system, and physical principles relating to the modelling being performed;

generating a FEM mesh comprising at least FEM mesh node locations relating to the portion of the physical system in dependence upon at least the physical dimensions of each element within the portion of the physical system;

automatically generating with a microprocessor FEM mesh values for each FEM mesh node location, the FEM mesh value established in dependence upon FEM mesh node location within the portion of the physical system, the material data and physical principles;

automatically generating with a microprocessor based upon the FEM mesh node locations a factor graph model, the factor graph model comprising a plurality of random variable nodes and a plurality of factor nodes; and automatically executing a set of belief propagation update rules upon the factor graph model using Gaussian function parameterization and the FEM mesh values, the belief propagation update rules comprising a factor node update rule that a factor node message is sent from each factor node of the plurality of factor nodes to all variable nodes of the plurality of variable nodes to which it is connected and a variable node update rule that a variable node message is sent back from a variable node to each factor node of the plurality of factor nodes to which it is connected; and iteratively executing the belief propagation update rules until a predetermined condition has been met.

In accordance with an embodiment of the invention there is provided a non-transitory computer-readable medium encoded with instructions for generating finite element modelling results, the instructions when executed by a microprocessor comprising:

receiving finite element method (FEM) data relating to establishing a FEM problem to be solved for a portion of a physical system being analysed, the FEM data comprising physical dimensions of each element within the portion of the physical system, material data relating the materials forming each element within the portion of the physical system, and physical principles relating to the modelling being performed;

generating a FEM mesh comprising at least FEM mesh node locations relating to the portion of the physical system in dependence upon at least the physical dimensions of each element within the portion of the physical system;

automatically generating with a microprocessor FEM mesh values for each FEM mesh node location, the FEM mesh value established in dependence upon FEM mesh node location within the portion of the physical system, the material data and physical principles;

automatically generating with a microprocessor based upon the FEM mesh node locations a factor graph model, the factor graph model comprising a plurality of random variable nodes and a plurality of factor nodes; and automatically executing a set of belief propagation update rules upon the factor graph model using Gaussian function parameterization and the FEM mesh values, the belief propagation update rules comprising a factor node update rule that a factor node message is sent from each factor node of the plurality of factor nodes to all variable nodes of the plurality of variable nodes to which it is connected and a variable node update rule that a variable node message is sent back from a variable node to each factor node of the plurality of factor nodes to which it is connected; and iteratively executing the belief propagation update rules until a predetermined condition has been met.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1A:
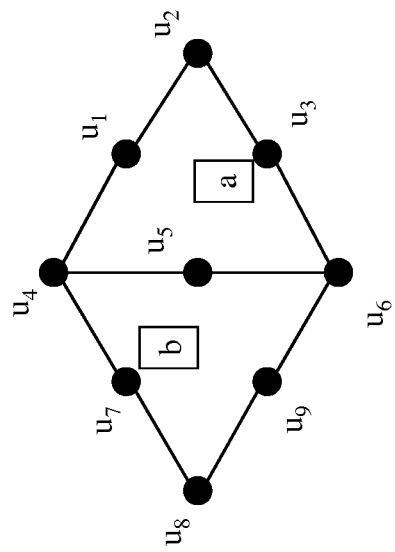
FIGS. 1A to 1C depict a sample FEM mesh of second-order triangles and the pairwise graphical model of the sample FEM sparse matrix, and the FEM Factor-Graph (FEM-FG) graphical model introduced by the inventors.

The present invention is directed to Finite Element Modelling (FEM) and more particularly to a FEM Multigrid Gaussian Belief Propagation (FMGaBP) via probabilistic inference with graphical models to expose distributed computations and remove global algebraic operations and sparse data-structures.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A. FGaBP and FMGaBP Algorithms

A.1 The FGaBP Algorithm

The Finite Element Gaussian Belief Propagation (FGaBP) algorithm is presented in three main stages in the following sections A.1.1 to A.1.3 respectively. First, the FEM problem is transformed into a probabilistic inference problem. Second, a factor graph model of the FEM problem, referred to as the FEM-FG model, is created to facilitate the execution of a computational inference algorithm such as BP. Finally, the FGaBP update rules and algorithm is presented.

A.1.1 FEM as a Variational Inference:

The variational form of the Helmholtz equation as discretized by the Finite Element Method (FEM) generally represented as Equation (1) where S S is the set of all finite elements (the local functions); $U_S$ are the field unknowns for element s; and $F_S$ is the energy-like contribution of each finite element. The local function $F_S$ takes a quadratic form that can be written as Equation (2) in which $M_S$ is the element characteristic matrix with dimensions nxn where n is the number of Local element Degrees of Freedom (LDOF), and $B_S$ is the element source vector.

$$F(U) = \sum_{s \in S} F_S(U_S) \quad (1)$$

$$F_S(U_S) = \frac{1}{2} U_S^T M_S U_S - B_S^T U \quad (2)$$

Conventionally, the FEM solution is obtained by setting $$\frac{\delta F}{\delta U} = 0,$$

which results in a large and sparse linear system of equations designated by Equation (3) where A is a large sparse matrix with dimensions N×N; N is the Global Degrees of Freedom (GDOF) of the system; and b is the Right-Hand Side (RHS) vector. The linear system is typically solved using iterative solvers such as the Pre-conditioned Conjugate Gradient (PCG) method when A is Symmetric Positive Definite (SPD). The FGaBP algorithm takes a different approach by directly minimizing the energy functional (1) using the BP inference algorithm. A variational inference formulation of FEM is created by modifying Equation (1) as given by Equations (4) and (5) where Z is a normalizing constant, and $\Psi_S(U_S)$ are local factor functions expressed by Equation (6).

$$Au = b \quad (3)$$

$$P(u) = \exp[-F] \quad (4)$$

$$= \frac{1}{Z} \prod_{s \in S} \Psi_S(U_S) \quad (5)$$

$$\Psi_S(U_S) = \exp\left[-\frac{1}{2} U_S^T M_S U_S + B_S^T U_S\right] \quad (6)$$

Considering applications where $M_S$ is SPD, the function $\Psi_S$, as in Equation (6), takes the form of an unnormalized multivariate Gaussian distribution. In addition, it can be shown using convex analysis, a subdomain of optimization theory, that P is a valid multivariate Gaussian distribution functional of the joint Gaussian random variables U. Accordingly, the solution point to the original problem, which is the stationary point of the functional F, can be restated as Equation (7). Since the Gaussian probability P is maximized when $U=\mu$, where $\mu$ is the marginal mean vector of P, the FEM problem can alternatively be solved by employing computational inference for finding the marginal means of U under the distribution P. Hence Belief Propagation (BP) inference algorithms can be employed to efficiently compute the marginal means of the random variables U.

A.1.2 FEM Factor Graph:

Because P is directly derived from the FEM variational form, it is conveniently represented in a factored form as shown in Equation (5). As a result, the inventors define a graphical model to facilitate the derivation of the BP update rules. One widely used graphical model is a Factor Graph (FG), which is a bipartite graphical model that directly represents the factorization of P. Within this specification, the inventors refer to such an FG as an FEM-FG. Referring to FIG. 1A a sample FEM mesh comprising two second-order triangles A and B each with 6 random variable nodes ($u_i$) of which 3 are common to the pair of second-order triangle.

Figure 1B:
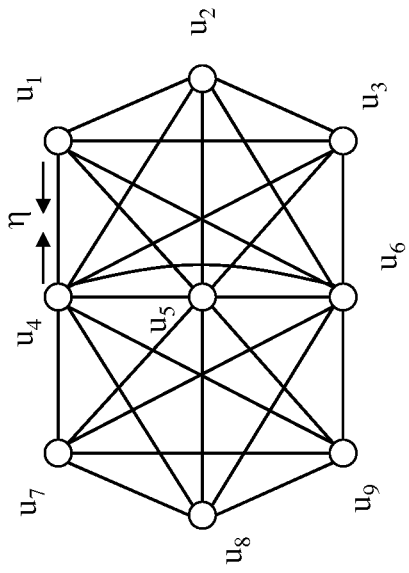
Figure 1C:
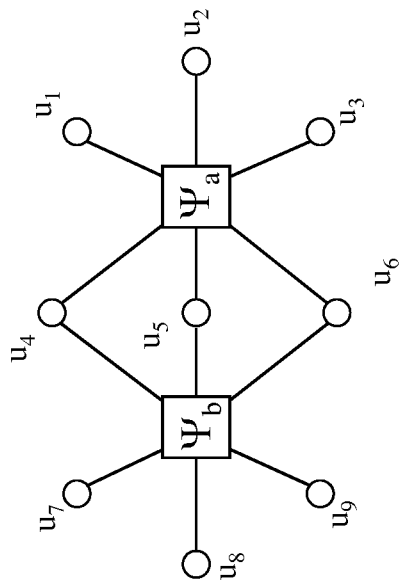

The FEM-FG, as shown in FIG. 1C, includes two types of nodes, a random variable node ($u_i$) representing each node in the unknown vector U, and a factor node representing the local factors $\Psi_S$. An edge is inserted between a variable node $\mu_i$, and a factor node $\Psi_S$, if $u_i$, is an argument of the local factor $\Psi_S$. Inference on FEM-FG can perform more dense and localized computations, especially for higher order FEM, as opposed to inference on the pairwise models based on sparse matrices.

An alternate prior pairwise graphical model is depicted in FIG. 1B wherein comparing this graphical model to FIG. 1C for the FEM-FG model on FEM elements of the second order shows a different structure since it requires a lower number of communication links. As shown the FEM-FG requires 12 links whilst the pairwise model requires 27 links. This is because FEM-FG can better exploit the FEM mesh structure than the pairwise model. Hence, inference on FEM-FG can perform more dense and localized computations in the factor nodes and requires less communication as opposed to inference on the pairwise factors used in the pairwise models.

A.1.3 Belief Propagation Update Rules:

Using the FEM-FG the general belief propagation (BP) update rules may be executed by passing two types of messages, Factor Node (FN) messages and Variable Node (VN) messages. A factor node message, denoted by $m_{a \to i}$, is sent from factor nodes a ($FN_a$) to the connected variable node i ($FN_i$); and a variable node message, $\eta_{i \to a}$, is sent back from $VN_i$ to $FN_a$. BP messages are basically probability distributions such that, a FN message $m_{a \to i}$ represents the distribution in terms of the continuous random variable $u_i$, or the most probable state of $u_i$, as observed from the FN $\Psi_S$. In return, the VN message $\eta_{i \to a}$ is a distribution in terms of $u_i$ representing observations from other connected factors. For simplicity, the inventors drop the arrow from the notation and represent messages between nodes a and i as $m_{ai}$ and $\eta_{ia}$ respectively. The general BF update rules are now stated as Equations (8) to (10) where t and $t_*$ are iteration counts such that $t_* \leq t$; N(a) is the set of all nodes' indexes connected to a node index a, referred to as the neighborhood set of a; N(a)\i is the neighborhood set of a, minus node i; $b_i(u_i)$, also referred to as the belief at node i. The integral in Equation (8) is multidimensional; however, since Gaussian distributions are used all the underlying variables, messages and $\Psi$, the integral can be solved in a closed form.

$$m_{ai}^{(t)}(U_i) \propto \int_{U_{N(a) \backslash i}} \Psi_a(U_a) \prod_{j \in N(a) \backslash i} \eta_{ja}^{(t_*)}(U_j) dU_{N(a) \backslash i} \tag{8}$$

$$\eta_{ia}^{(t)}(U_i) \propto \prod_{k \in N(i) \backslash a} m_{ki}^{(t_*)}(U_j) dU_{N(a) \backslash i} \tag{9}$$

$$b_i^{(t)}(U_i) \propto \prod_{k \in N(i)} m_{ki}^{(t)}(U_i) \tag{10}$$

A.1.4 FGaBP Update Rules:

To facilitate the derivation of the BP update rules, the inventors use the following Gaussian function parameterization as given in Equation (11) where $\alpha$, is the reciprocal of the variance, and $\beta/\alpha$ is the Gaussian mean. This parameterization results in simplified BP message update formulas that are only functions of parameters $\alpha$ and $\beta$. The following sequence defined by steps FGaBP-1 through FGaBP-5 is the formulation of the FGaBP algorithm update rules.

FGaBP-1: Iterate $t_* = 1, 2, \ldots$ and $t \geq t_*$.

FGaBP-2: For each $VN_i$ process: compute messages ($\alpha_{ia}$, $\beta_{ia}$) to each $FN_a$ such that $a \in N(i)$, as given by Equations (12) and (13).

$$\alpha_i^{(t_*)} = \sum_{k \in N(i)} \alpha_{ki}^{(t_*)}, \alpha_{ia}^{(t)} = \alpha_i^{(t_*)} - \alpha_{ai}^{(t_*)} \tag{12}$$

$$\beta_i^{(t_*)} = \sum_{k \in N(i)} \beta_{ki}^{(t_*)}, \beta_{ia}^{(t)} = \beta_i^{(t_*)} - \beta_{ai}^{(t_*)} \tag{13}$$

FGaBP-3: For each $FN_a$ process:

(a) Receive messages ($\alpha_{ia}^{(t_*)}, \beta_{ia}^{(t_*)}$), where $i \in N(a)$;

b) Define $A^{(t_*)}$ and $B^{(t_*)}$ such that $A^{(t_*)}$ is a diagonal matrix of incoming $\alpha_{ia}^{(t_*)}$ parameters, and $B^{(t_*)}$ is a vector of incoming $\beta_{ia}^{(t_*)}$ parameters as depicted in Equations (14A) and (14B) respectively. Then, compute W and K using Equations (15A) and (15B) respectively.

$$A^{(t_*)} = \begin{bmatrix} \alpha_{1a}^{(t_*)} & 0 & \ldots & 0 \\ 0 & \alpha_{2a}^{(t_*)} & \ldots & 0 \\ \ldots & \ldots & \ldots & \ldots \\ 0 & 0 & \ldots & \alpha_{na}^{(t_*)} \end{bmatrix} \tag{14A}$$

$$B^{(t_*)} = \begin{bmatrix} \beta_{1a}^{(t_*)} \\ \beta_{2a}^{(t_*)} \\ \ldots \\ \beta_{na}^{(t_*)} \end{bmatrix} \tag{14B}$$

$$W^{(t_*)} = M + A^{(t_*)} \tag{15A}$$

$$K^{(t_*)} = B + B^{(t_*)} \tag{15B}$$

where M and B are the element a characteristic matrix and source vector as defined in Equation (6) with s=a.

c) Partition $W^{(t_*)}$ and $K^{(t_*)}$ according to Equations (16A) and (16B) where $\Re(i)$ is the local index corresponding to the global variable node i.

$$W^{(t_*)} = \begin{bmatrix} W_{\Re(i)}^{(t_*)} & V^T \\ V & \overline{W}^{(t_*)} \end{bmatrix} \tag{16A}$$

$$K = \begin{bmatrix} K_{\Re_i}^{(t_*)} \\ \overline{K}^{(t_*)} \end{bmatrix} \tag{16B}$$

d) Compute and send $FN_a$ messages ($\alpha_{ia}^{(t)}, \beta_{ia}^{(t)}$) to each $VN_i$ according to Equations (17A) and (17B) respectively.

$$\alpha_{ai}^{(t)} = M_{\Re(i)} - V^T (\overline{W}^{(t_*)})^{-1} V \tag{17A}$$

$$\beta_{ai}^{(t)} = B_{\Re(i)} - (\overline{K}^{(t_*)})^T (\overline{W}^{(t_*)})^{-1} V \tag{17B}$$

FGaBP-4: A priori, all messages can be initialized as $\alpha = 1$ and $\beta = 0$. Messages can be communicated according to any schedule or these may be performed subject to a particular schedule either sequential or parallel.

FGaBP-5: At message convergence, the means of the VN s, or solutions, $\mu_i$ can be obtained using Equation (18).

$$u_i^{(t)} = \mu_i^{(t)} = \frac{\beta_i^{(t)}}{\alpha_i^{(t)}} \tag{18}$$

Whilst messages can communicated according to any schedule, message scheduling can considerably affect the convergence rate. There are two well-known scheduling schemes for BP, sequential (asynchronous) and parallel (synchronous). Since FEM elements exhibit geometrical locality in meshes. Factor nodes adjacent to each others could be assigned the same processing element in order to compute using sequential messages; while communications between factor nodes in different processing elements can be performed using parallel messages. This hybrid-scheduling shows considerably lower increase in iterations due to parallel scheduling for FEM applications.

The FGaBP update rules in Equations (17A) and (17B) are based on distributed local computations performed using matrices of order (n−1). Accordingly, it would be evident that the FGaBP algorithm according to embodiments of the invention does not need to assemble a large global system of equations nor does it perform any operations on sparse matrices as required in conventional implementations of PCG. Also, the FGaBP update rules are generally applicable to any arbitrary element geometrical shape or interpolation order.

A.1.5 Boundary Element Treatment:

Essential boundary conditions, such as Dirichlet conditions, are incorporated directly into $\Psi_S$ in Equation (6). Once boundary conditions are incorporated, then FGaBP communicates informative messages between variable nodes only. To setup boundary FN s, the VN ($U_S$) of a boundary are first partitioned into $U_S = [U_{\{v\}}, U_{\{c\}}]$ where v is the set of indexes for interior VN s and c is the set of indexed for boundary VN s. Then the boundary FN matrix $M_S$ and vector $B_S$ in Equation (6) are modified to yield Equations (19) and (20) where $B_v$, $M_{vv}$, and $M_{vc}$ are the sub-vector and the sub-matrix partitions corresponding to the $U_v$ and $U_c$ partitions. After incorporating the boundary conditions, the FGaBP update rules are executed on boundary elements as normal.

$$M_S = M_{vv} \quad (19)$$

$$B_S = B_v - M_{vc} U_c \quad (20)$$

A.2 The FMGaBP Algorithm

As noted above the FGaBP solves the FEM problem by passing locally computed messages on a graphical model comprised of factor and variable nodes. However, when the discretization level becomes finer, or the number of elements and variables increases, the FGaBP convergence time increases due to the increased time required for information propagation across the nodes within the graphical model. Within the prior art attempts to improve convergence through message relaxation schemes have been proposed but the number of iterations remains proportional to the number of problem variables. Within the prior art so-called Multigrid (MG) acceleration schemes have been demonstrated to yield enhanced convergence speeds such that the number of iterations are almost independent of the FEM mesh discretization level. The FGaBP algorithm therefore could benefit from MG schemes primarily as BP communications on coarser levels (grids) can serve as bridges to communications between far away nodes on finer levels (grids). In this manner the overall information propagation in the FEM-FG model is improved and accordingly convergence time reduced. As described below, the convergence rates for multigrid FGaBP (FMGaBP) algorithms according to embodiments of the invention are essentially independent of the domain's discretization level. In addition, FMGaBP retains the distributed nature of the computations within the FGaBP algorithm which has important benefits for parallel processor implementations. Essentially, the FMGaBP level transfer operations are computationally decoupled and localized without requiring any global sparse algebraic operations. To illustrate the FMGaBP formulation, a multivariate distribution, associated with each $FN_a$, called the factor node belief $b_a$ is defined in the form of a multivariate Gaussian distribution such as that described by Equation (21) where $U_a$ is a vector of random unknowns linked to the $FN_a$. The belief $b_a$, unlike the nodal belief $b_i$ defined in Equation (10), represents the marginal distribution as seen from $FN_a$ in a specific iteration t.

$$b_a^{(t)}(U_a) \propto \exp\left[-\frac{1}{2} U_a^T W_a^{(t)} U_a + (K_a^{(t)})^T U_a\right] \quad (21)$$

The message update rules of the BP algorithm in Equations (8), (9), and (10), show that at message convergence the joint mean of the distribution $b_a$, given by $\overline{U}_a = W_a^{-1} K_a$, will be equal to the marginal means of each of the random unknowns $U_a$ as computed from a global perspective by Equation (18). In other words, the means computed from local beliefs will agree with the marginal means computed from the global perspective at message convergence. Using this observation, a quantity referred to as the belief residual $r_a$ may be formulated as given by Equation (22).

$$r_a^{(t)} = K_a^{(t)} - W_a^{(t)} \overline{u}_a^{(t)} \quad (22)$$

Figure 3B:
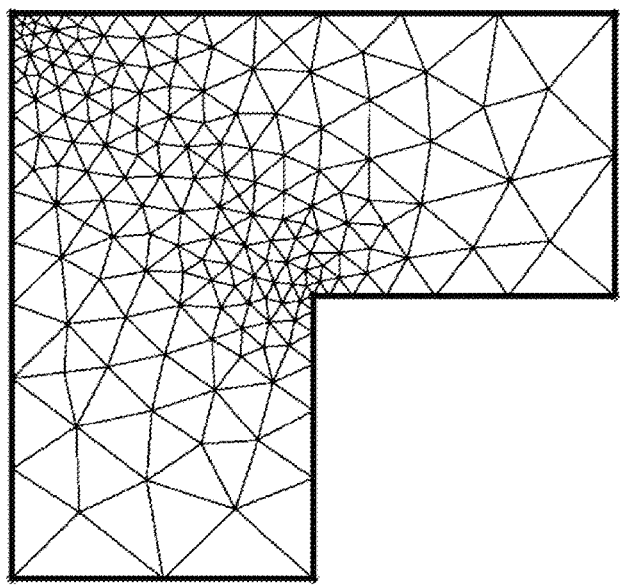
FIGS. 3B and 3C depict a course initial irregular mesh and a refined mesh by splitting for solving an electromagnetic problem at the corner of a conductor in a dielectric.
Figure 3C:
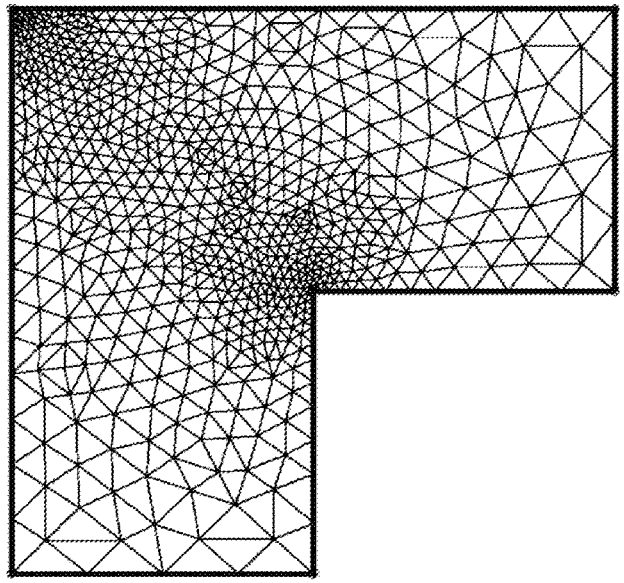
Figure 3A:
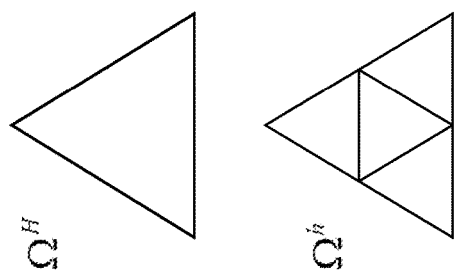
FIG. 3A depicts a mesh refinement by splitting each triangle within a mesh into four geometrically similar sub-triangles to produce a finer mesh.
Figure 3D:
FIG. 3D depicts local node numbering for each parent-child element set using quadrilaterals for a parent mesh sub-divided into a child mesh.

Using multiple grids with refinement by splitting and a consistent local node numbering between each set of parent-child elements, such as depicted in FIGS. 3A and 3D, the belief residuals of each group of child elements can be locally restricted to the parent element according to Equation (23) where $K_a^H$ is the source vector of the parent element, $r_a^h$ is the accumulated local residual of child elements, and $R_l$ is the child-parent local restriction operator. The iteration count (t) is dropped because both sides of the equation are operated in the same iteration. Similarly, we can use local operations for interpolation to apply the corrections from the coarse elements as given by Equation (24).

$$K_a^H = R_l r_a^h \quad (23)$$

$$\overline{u}_a^h \leftarrow \overline{u}_a^h + \Im_l \overline{\mu}_a^h \quad (24)$$

Using the level updated $\overline{u}_a^h$ we can reinitialize the corresponding level local messages with again using Equation (22) but for $r_a \to 0$. In this manner the algorithm would then solve for $K_a$ and the incoming messages. In this setup, the $\alpha_{ai}$ messages of each corresponding level are kept without modifications and only the $\beta_{ai}$ messages are reinitialized. For self-adjoint problems, $R_l$ is typically the transpose of $\Im_l$. Since convergence is achieved when the level restricted local belief residuals approach zero, then the resulting multigrid FMGaBP algorithm becomes a fixed-point algorithm for the true stationary solution point on the finest mesh.

B. Results

B.1 FGaBP Algorithm

Figure 2A:
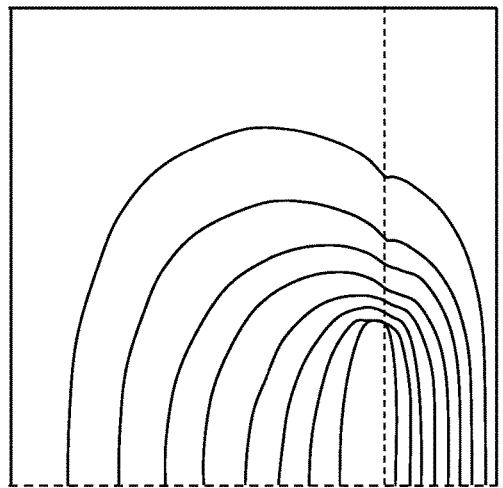
FIGS. 2A and 2B depict a shielded microstrip with two dielectric media problem and the Poisson's solution to it.
Figure 2B:
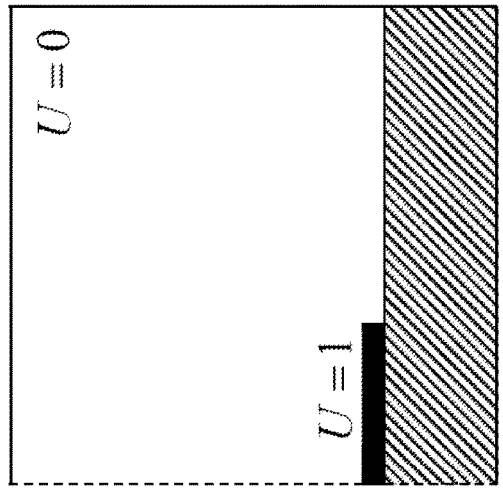

The FGaBP algorithm is demonstrated by solving Poisson's equation on a shielded microstrip line with two dielectric media using irregular triangular meshes as depicted in FIGS. 2A and 2B. Different trials are performed by increasing the order of the FEM interpolation from $1^{st}$ to $5^{th}$ order while reducing the number of elements so as to keep the number of unknowns approximately similar. As can be seen from the number of links data in Table 1 the FGaBP model improves memory communication for element orders greater than one by reducing the number of communication links in the resulting FEM-FG model compared to solvers of pairwise (PW) models, or global sparse matrix operations.

TABLE 1

Shielded Microstrip Results for FGaBP and PW-GaBP

| Order | No. Variables | Triangles | PW-Links | FG-Links | PW-GaBP Iterations | FGaBP Iterations | CPU SU |
|---|---|---|---|---|---|---|---|
| $1^{st}$ | 10076 | 19252 | 26799 | 57756 | 542 | 1486 | 1.1 |
| $2^{nd}$ | 9818 | 4787 | 48026 | 28722 | 3582 | 3221 | 1.3 |
| $3^{rd}$ | 10108 | 2191 | 74841 | 21910 | — | 1762 | 2.1 |
| $4^{th}$ | 10131 | 1237 | 105583 | 18555 | — | 1564 | 3.2 |
| 5th | 10056 | 786 | 139365 | 16506 | — | 1362 | 3.4 |

Also shown in Table I are the iteration results of FGaBP and the prior PW-GaBP. The iterations were terminated on all experiments when the final residue reached $10^{-9}$. It is important to note that PW-GaBP and likewise Pre-Conditioned Conjugate Gradient (PCG), requires global large sparse matrix operations in each iteration limiting its effectiveness in parallel implementations; while in contrast, FGaBP requires completely decoupled computations element-by-element. The last column of Table 1 shows the speedup (SU) results of FGaBP using a naive parallel implementation on a quad-core CPU over the sequential one on the same workstation. Although the implementation was not optimized, FGaBP illustrated increased efficiency of parallel implementation as the interpolation order increases. This is due to FGaBP making good use of increased localized computations and reduced memory communications.

Further, it can be seen from Table 1 that PW-GaBP failed to converge as the interpolation order increased beyond the $2^{nd}$ order because the resulting global matrix is very ill-conditioned. In contrast, the FGaBP successfully converged for all cases demonstrating a convergence improvement over PW-GaBP and likewise Gauss-Seidel (GS) and Successive-over-Relaxation (SOR). This result incites further investigation on the theoretical convergence behaviour of GaBP algorithms for FG graphical models.

B.2 FMGaBP Algorithm

Figure 4A:
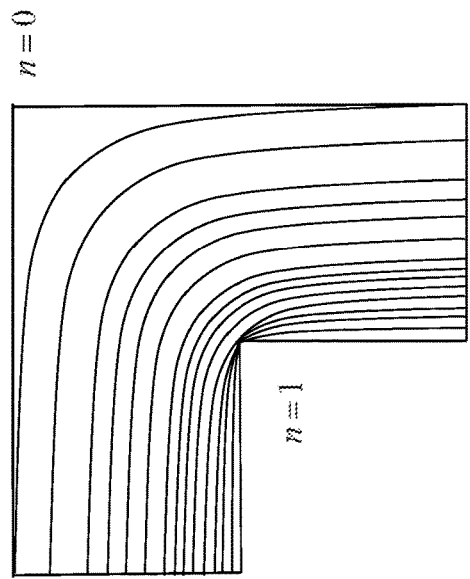
FIGS. 4A and 4B depict Laplace equipotential contours obtained with FMGaBP according to an embodiment of the invention for the shielded strip between two different dielectric materials and top-right symmetric square corner of a conductor within a dielectric material problems respectively.
Figure 4B:
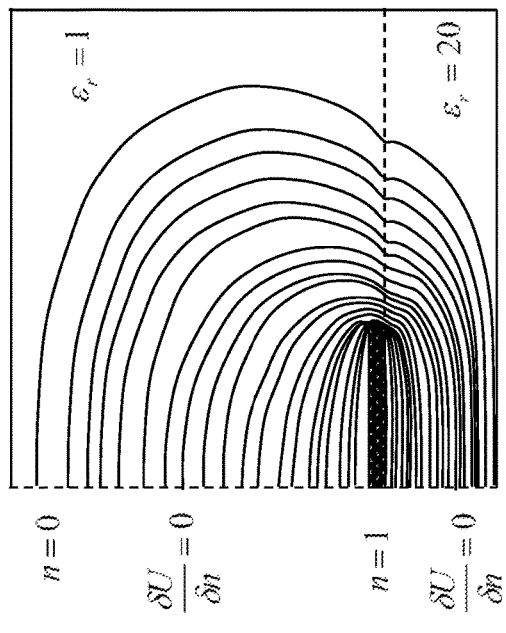

The performance of the FMGaBP algorithm was demonstrated using two Laplace benchmark problems as shown in FIGS. 4A and 4B. The first problem is the shielded microstrip conductor (SSC) using two different material properties; and the second is the L-shaped corner of the square coaxial conductor (LSC). Both problems employ Dirichlet and Neumann boundary conditions. The FMGaBP according to an embodiment of the invention was coded using a C++ object-oriented programming approach. The element matrices and source vectors are the only inputs to the FMGaBP algorithm. Two open-source software libraries were used to formulate the FEM problem and assemble the local element matrices and vectors. The SSC problem was formulated using the library GetFEM++ with semi-irregular triangular meshes; whilst the LSC problem was formulated using the library deal.II with hierarchical quadrilateral meshes. Since deal.II inherently supports hierarchical meshes and multigrid solvers using parallel implementations it was used for performance comparisons. A V-cycle multigrid scheme was employed in all analyses and all solvers were terminated when the residual l²-norm reduced to $10^{-15}$ and below. to 10-". The FMGaBP algorithm uses the iterative FGaBP as the coarsest level solver; whereas, a Householder direct solver was used in deal.II for the Multigrid Pre-Conditioned Conjugate Gradient (MG-PCG) solver.

Referring to Table 2 there are presented the FMGaBP convergence results for the SSC problem. These results demonstrate a convergence performance almost independent of the number of unknowns in the finest level. However, a trend of slightly increasing number of iterations is observed. This increase is expected due to the strongly varying material coefficients at the dielectric-metal, dielectric-air, and metal-air interfaces.

Table 3 presents the FMGaBP results for the LSC problem compared with the results from deal.II prior art solver. The timing results were obtained using a compute node with two quadcore Intel Xeon X5560 Nehalem processors of type with 2.8 GHz clock and 8 MB cache. Problem sizes up to 12.6 million unknowns were solved. OpenMP was used to parallelize the FMGaBP with a coloring algorithm employed to ensure thread safety. For all timing cases, the best of forty runs is reported. The MG-PCG solver, used for comparison, is provided by deal.II configured with multi-threading enabled.

TABLE 2

Iterations of FMGaBP for SSC Problem using Five Levels of Refinement
(where $v_1 = 1; v_2 = 1$ are pre-and post-smoothing iterations)

| Refinement Level | Unknowns | Triangles | Iterations $v_1 = 1; v_2 = 1$ |
|---|---|---|---|
| 1-Coarse | 222 | 382 | — |
| 2 | 825 | 1,528 | 9 |
| 3 | 3,177 | 6,112 | 11 |
| 4 | 12,465 | 24,448 | 13 |
| 5 | 49,377 | 97,792 | 15 |
| 6 | 196,545 | 391,168 | 16 |

TABLE 3

FMGaBP Speed-Up over Deal.II using 8-Threads on 2xQuadcore Processors (where $t_{st}$-$t_{sv}$ refer to setup and solve times respectively in seconds and itr refers to iterations)

| Unknowns | Quads. | FMGaBP | | | MG-PCG | | | Speedup | |
|---|---|---|---|---|---|---|---|---|---|
| ×10⁶ | ×10⁶ | itr. | $t_{st}$ | $t_{sv}$ | itr. | $t_{st}$ | $t_{sv}$ | setup | solve |
| 0.788 | 0.786 | 6 | 2.6 | 0.98 | 10 | 6.14 | 2.56 | 2.4 | 2.6 |
| 3.15 | 3.15 | 6 | 10.5 | 3.74 | 10 | 27.5 | 10.4 | 2.6 | 2.8 |
| 12.6 | 12.6 | 6 | 43.1 | 14.2 | 10 | 108 | 41.5 | 2.5 | 2.9 |

As shown in Table 3, the FMGaBP algorithm requires close to half the iteration count of MG-PCG. In addition, the FMGaBP algorithm demonstrates considerable time speedups for both the total setup time and the solve time. Setup operations were not parallelised in deal.II at the time of this work, therefore sequential execution time is reported for the setup phase. The major reductions in setup time were due to the fact that the FMGaBP contrary to the deal.II library does not require the setup of globally large sparse matrices or level transfer matrices. The FMGaBP was also demonstrated by the inventors with parallel solve time speedups of up to 2.9 times over those of deal.II's MG-PCG solver. This speedup was primarily due to two factors, the considerable iteration reductions and the higher parallel efficiency of FMGaBP. As a key factor, the FMGaBP implements the level transfer operations as parallel and local stencil-like operations that are inherently thread-safe.

Figure 5:
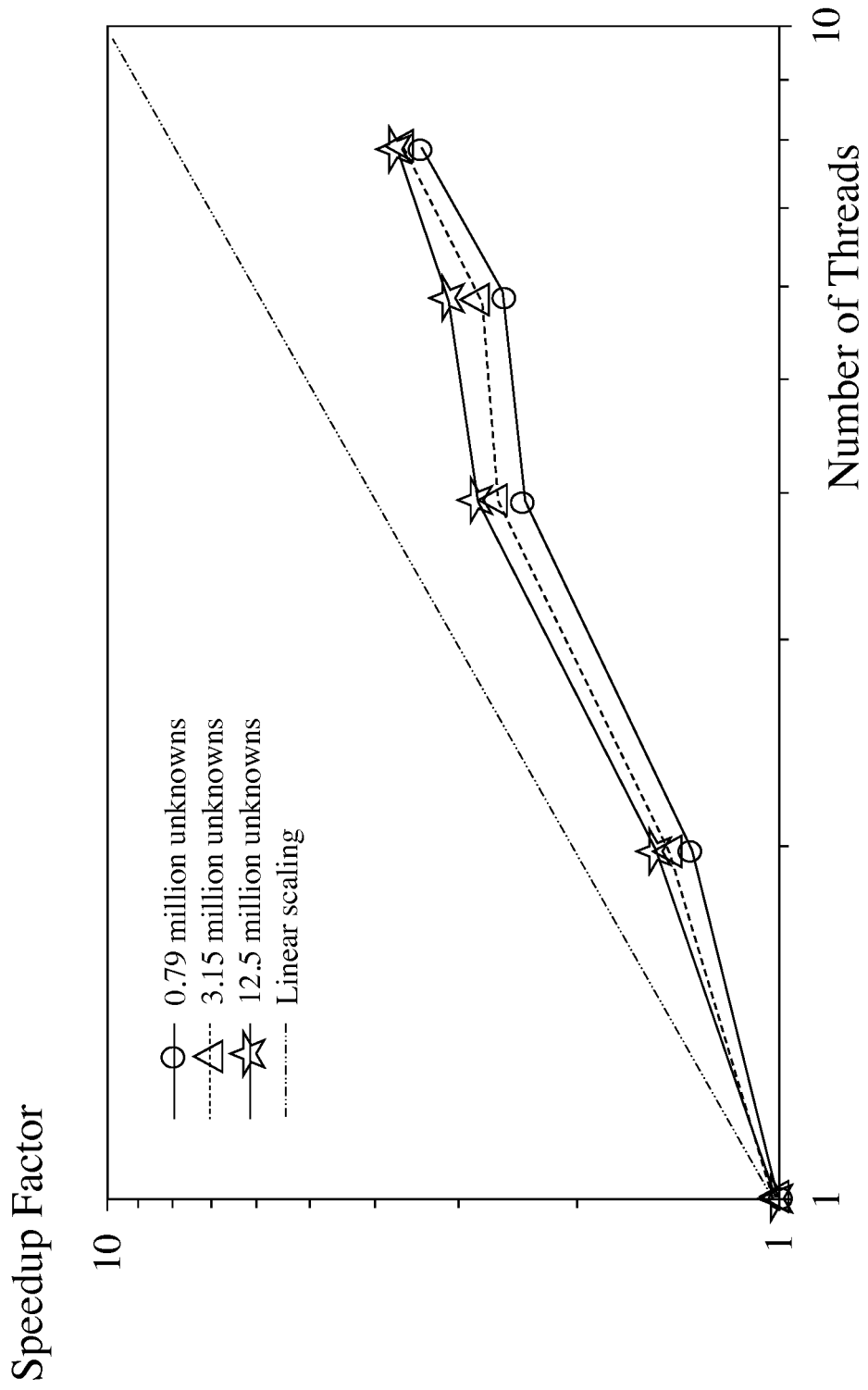
FIG. 5 depicts speedup factors for FMGaBP according to an embodiment of the invention over sequential execution on 2× quadcore processors node versus number of processing threads.

Referring to FIG. 5 the speedup factors of FMGaBP for three problem sizes scaled for eight threads are presented. FIG. 5 demonstrates that FMGaBP exhibits approximately linear trends of speedups with increasing number of threads and show increased parallel efficiency as the problem size increases.

Referring to FIGS. 3A to 3C the FEM mesh of the L-shaped portion of the square coaxial-line problem is shown within a FMGaBP solver according to an embodiment of the invention. The multigrid methodology generates a hierarchy of meshes by triangle splitting starting from an irregular course mesh. This is depicted in FIG. 3A where a triangle forming part of a mesh $\Omega^H$ is split into four geometrically similar sub-triangles to produce a finer mesh $\Omega^h$. Accordingly, the initial mesh of the L-shaped region depicted in FIG. 3B after an iteration of mesh splitting is depicted in FIG. 3C where it can be seen that the splitting of a triangle into four geometrically similar sub-triangles is maintained even for non-equilateral triangles.

Within the simulations a V-cycle multigrid scheme is employed where the parameters $v_1=1$ and $v_2=1$ are the number of pre- and post-smoothing iterations respectively. As FMGaBP operates on an element-by-element basis, then the computational load is increased by a factor of four for each mesh refinement level. Table 4 shows a comparison of FMGaBP with respect to FGaBP.

TABLE 4

Computational Reduction Factors for FMGaBP for the L-shaped Conductor Problem

| Refinement Level | No. Variables | Triangles | FGaBP Relaxed | FMGaBP $v_1 = 1$; $v_2 = 1$ | Computation Reduction Factor |
|---|---|---|---|---|---|
| 1 | 825 | 1,556 | 425 | — | — |
| 2 | 3,205 | 6,224 | 931 | 12 | 39 |
| 3 | 12,633 | 24,896 | 3,663 | 12 | 122 |
| 4 | 50,161 | 99,584 | 13,109 | 12 | 416 |

The solver was terminated when the relative error $l^2$-norm reduced to below $10^{-9}$. The FMGaBP results demonstrate a multigrid acceleration performance that is independent of the number of unknowns on the finest level. This performance is illustrated by the amount of computational load reduction as the number of levels is increased. The computational reduction factors are computed by FGaBP_Operations/FMGaBP_Operations.

Figure 6:
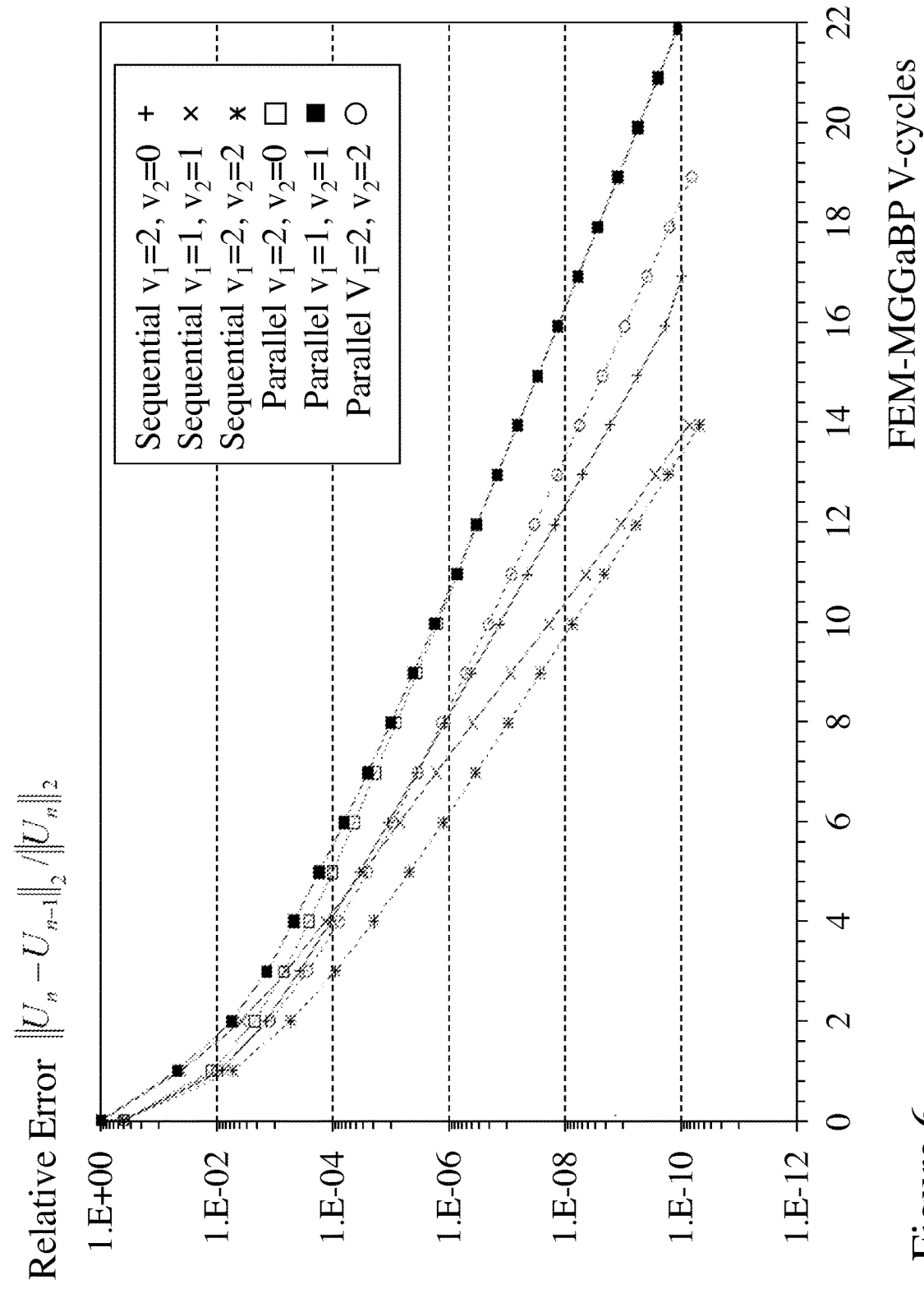
FIG. 6 depicts the sequential and parallel scheduled FMGaBP algorithm according to an embodiment of the invention on a four level hierarchical mesh of the L-shaped conductor problem.
Figure 7B:
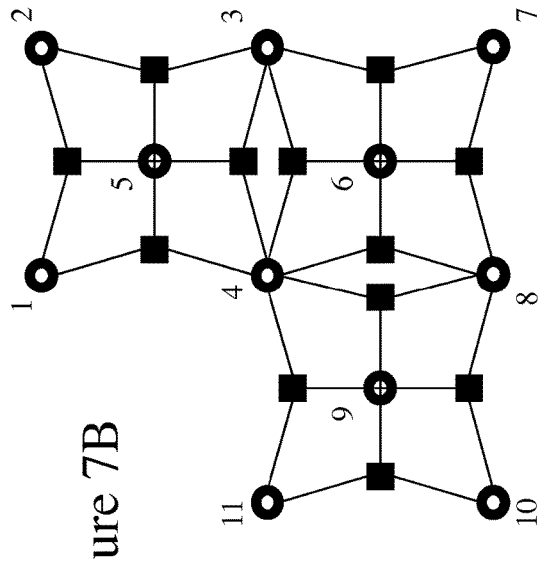
FIG. 7A to 7D depict a triangular element merging example for a FMGaBP approach according to an embodiment of the invention showing the original triangular mesh, initial FEM-FG using single element factorization, merging two adjacent triangles, and merging adjacent four triangles.
Figure 7D:
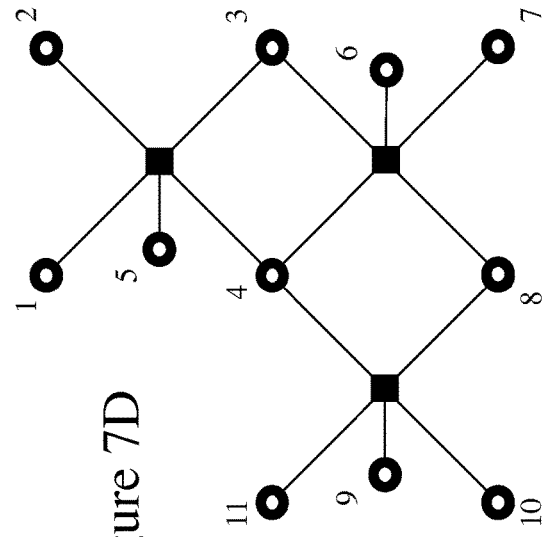
Figure 7A:
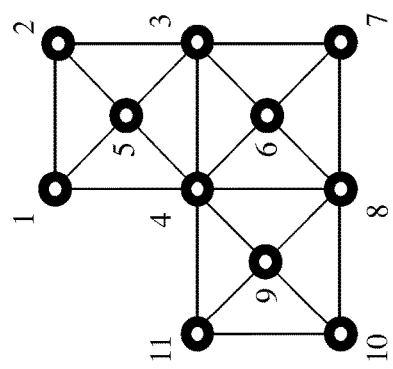
Figure 7C:
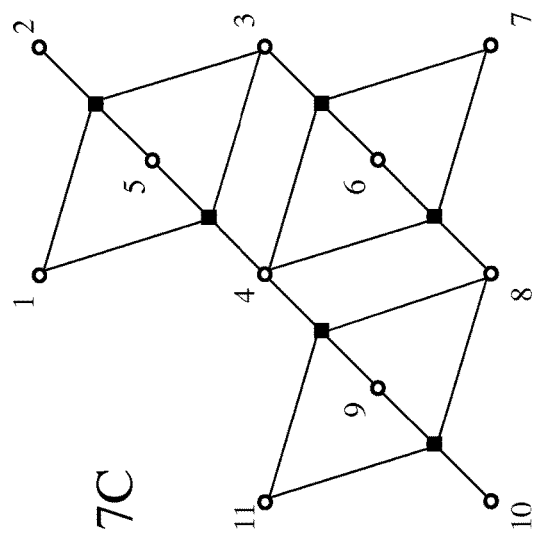

Now referring to FIG. 6 there is depicted the convergence rates for different pre-smoothing and post-smoothing settings as well as for different messaging schemes. The sequential message schedule provides the fastest convergence rates; however, it is not practical for parallel hardware implementations. It is important to note that the parallel scheduled FMGaBP has comparable performance to the sequentially scheduled one showing that FMGaBP is sustaining high parallel efficiency. One parallel schedule scheme employed by the inventors was based on a mesh triangle coloring approach, where messages of triangles of the same color are synchronized concurrently. This coloring scheme requires minimal overhead processing due to the utilized hierarchical mesh refinement scheme.

C. FGaBP Re-Formulations

It is evident from the FGaBP update rules given by Equations (12), (13), (17A), and (17B) that the FGaBP computational complexity per iteration is dominated by the FN processes. Because of the matrix inversion required by each FN, the total FGaBP complexity per iteration, when using the Cholesky algorithm, is $O(N_f n(n-1)^3/3) \approx O(N_f n^4/3)$ where $N_f$ is the number of FN s. For FEM problems, $N_f$ is typically proportional to N. In addition, we have $n \ll N_f$, e.g. for triangular meshes $n=3$ and tetrahedral meshes $n=4$. More importantly, n is independent of $N_f$ which implies that the FGaBP algorithm can offer high parallel scalability for a good choice of message scheduling, as will be discussed below. However, due to the high FN computational complexity, the local computational cost may dominate as n increases when supporting higher degree FEM basis functions, or for example $n \geq 5$.

It would be beneficial if the complexity of the FGaBP was reduced. Within the following section the inventors describe the reformulation of the FGaBP process that reduces the FN complexity to $O(n^2)$. Additionally, the inventors present schemes such as element merging and color-based message scheduling that further enhance the parallel efficiency of the FGaBP algorithm by better exploiting its distributed computations.

C.1 Reduced Complexity FGaBP

The FN update rules can be reformulated using the partitioned matrix inversion identity as given by Equations (25A) and (25B) where $\tilde{P}=N$, $\tilde{Q}=-NQS^{-1}$, $\tilde{R}=-S^{-1}RN$, $\tilde{S}=S^{-1}+S^{-1}RNQS^{-1}$, and $N=(P-QS^{-1}R)^{-1}$. Further, within the algorithms according to embodiments of the invention P is a single element matrix and R is equal to $Q^T$ with dimensions $(n-1) \times 1$. The FN update rules can alternatively be obtained by directly computing the inverse of W, partitioning it as given by Equation (26), such that the FN updates are given by Equations (27) and (28) respectively.

$$Z = \begin{bmatrix} P & Q \\ R & S \end{bmatrix} \quad (25A)$$

$$Z^{-1} = \begin{bmatrix} \tilde{P} & \tilde{Q} \\ \tilde{R} & \tilde{S} \end{bmatrix} \quad (25B)$$

$$(W^{(t_*)})^{-1} = \begin{bmatrix} \tilde{W}_{\mathcal{J}(i)} & \tilde{C}^T \\ \tilde{C} & \tilde{D} \end{bmatrix} \quad (26)$$

$$\alpha_{ai}^{(t)} = \frac{1}{\tilde{W}_{\mathcal{J}(i)}} - \alpha_{ai}^{(t_*)} \quad (27)$$

$$\beta_{ai}^{(t)} = B_{\mathcal{J}(i)} + \frac{1}{\tilde{W}_{\mathcal{J}(i)}} (\tilde{K}^{(t_*)})^T \tilde{C} \quad (28)$$

Using an in-place Cholesky inversion algorithm to compute $(W^{(t_*)})^{-1}$, the FN complexity can be reduced to $O(n^3/3)$. Since W is small and dense, optimized linear algebra libraries can be used to compute its inverse efficiently, e.g. Eigen, Gmm++, and Lapack. For those cases where n is relatively large, e.g. $n \geq 5$, computing the inverse can be costly. As shown in Equation (7), the FEM solution requires only finding the marginal means which are the ratios of the nodal parameters $\beta_i$ and $\alpha_i$ as shown in Equation (18). Accordingly, substituting Equation (13) with Equation (28) and rearranging terms then we obtain Equation (29) which can be seen as a local element approximate solution obtained from the FN for the $VN_i (i \in N(a))$ and for the fixed $\alpha$ messages. Now, if we partition W as W=D−E−F such that D is the main diagonal of W while E and F are the lower and the upper off-diagonals of W correspondingly, a local stationary, fixed-point, iterative process can be created within each FN. For example, Equation (30) would constitute a Gauss-Seidel (GS) iteration. Other fixed-point iterative methods such as Jacobi or successive over-relaxation (SOR) can also be configured.

$$\bar{u}_a^{(t)} = (W^{(t*)})^{-1} K^{(t*)} \quad (29)$$

$$\bar{u}_a^{(t)} = (D-E)^{-1} F \bar{u}_a^{(t*)} + (D-E)^{-1} K^{(t*)} \quad (30)$$

The $\alpha$ messages can be fixed after allowing the FGaBP algorithm to execute normally for a couple of iterations, or until the $\alpha$ messages converge to a very high tolerance such as $10^{-1}$. This should replace the initial values in the $\alpha$ messages with better estimates. Then a number of iterations are executed using Equation (29) to obtain a better estimate for $\bar{u}_a$. The inventors have typically found from the simulations and modelling performed that one or two iterations of GS was normally sufficient. Finally, the new $\beta_{ai}^{(t)}$ messages are obtained from the $\bar{u}^{(t)}$ estimates using Equation (31) where $t_O$ is the iteration in which the $\alpha$ messages are fixed.

$$\beta_{ai}^{(t)} = \bar{u}^{(t)} \alpha_i^{(tO)} - \beta_i^{(t*)} + \beta_{ai}^{(t*)} \quad (31)$$

By employing this approach, the FN process complexity is reduced to approximately $O(n^2)$. It can be shown that the fixed-point solutions, or marginal means, of the original FGaBP update rules are equal to the fixed-point solutions of the new FGaBP update rules. However, the final message parameters, $\alpha$ and $\beta$, may be different between the two algorithms. The inventors refer to this reduced complexity algorithm as the approximated update (AU) FGaBP algorithm.

C.2 Element Merging FGaBP

Within this aspect of the specification the inventors present variations to the graphical structure of the FGaBP algorithm in order to increase the parallel efficiency of the FGaBP when executed upon multicore architectures with suitable cache capacities. The FEM-FG factorization structure allows redefining new factors within Equation (5) by joining other factors as given in Equation (32) where $s_1$ and $s_2$ are joined into factor $\hat{s}$, which is a function of the $U_{\hat{s}} = U_{S_1} \cup U_{S_2}$. Once suitable elements are identified for merging, the FGaBP algorithm can be executed normally after locally assembling the merged element matrices and source vectors. When the factors are adjacent, the cardinality of $U_{\hat{s}}$ is $|U_{\hat{s}}| = |U_{S_1}| + |U_{S_2}| - |U_{S_1} \cap U_{S_2}|$ $$\Psi_{\hat{s}}(U_{\hat{s}}) = \Psi_{S_1}(U_{S_1}) \Psi_{S_2}(U_{S_2}) \quad (32)$$

Element Merging (EM) can be particularly advantageous if elements sharing edges in 2D meshes or surfaces in 3D meshes are merged. As a result, the memory bandwidth utilization can improve because of considerable edge reduction in the FEM-FG graph. By merging adjacent elements, the high CPU computational throughput can be better utilized in exchange for the slower memory bandwidth and latency. EM can be mainly useful for 2-D triangular and 3-D tetrahedral meshes with first order FEM elements. To quantify the effect of merging, we define the percentage of Merge Reduction Ratio (MRR) by dividing the amount of reduced memory from the merge by the original amount of memory before the merge. The MRR is computed according to Equation (33) where D is the set of all factors before any merge, C is the set of merged factors, and $M_O$ is the amount of memory required for $FN_a$.

$$MRR = \frac{\sum_{a \in D} M_a - \sum_{a \in C} M_a}{\sum_{a \in D} M_a} \quad (33)$$

Considering the particular implementation detailed later in Section D Implementation Techniques, the memory complexity per factor node can be obtained by $M_i \propto O(4n_a + n_a^2)$ where $n_a$ is the number of $VN_a$ edges, or the rank of $M_a$. If we consider structured meshes, for illustration purposes only, the resulting MRR is 23.8% when merging every two adjacent triangles into a quadrilateral, or 46.4% when merging every four fully connected triangles into a quadrilateral. Referring to FIGS. 7A to 7D there are illustrated different FEM-FG graphs from merging every two or every four adjacent triangles in a structured triangular mesh.

For irregular triangular meshes with a large number of triangles, Euler's formula states that each vertex will be surrounded by six triangles on average. Thus, when merging mostly six triangle groups into hexagons, the MRR increases to 38.9%, or to 42.9% when merging five triangles. Merging triangles does not have to be uniform. We may decide to merge patches of 2, 3, 4, 5, 6, or more as long as the triangles share edges and form connected, or preferably, convex regions. Similarly for 3D tetrahedral meshes, merging tetrahedrons sharing faces can also result in significant memory storage reductions if two tetrahedrons of first order are merged, the MRR is 29.7%, and 53.1% when merging three tetrahedrons sharing faces and are enclosed by five vertexes.

While merging elements based on a structured mesh is a relatively simple operation, we can still efficiently merge certain element configurations in unstructured meshes by using partitioning algorithms. Partitioning may add some overhead in the pre-processing stage; however, since in practice the number of factors is much greater than the number of CPU cores, a lower partition quality can be used to lower the partitioning overhead time without having much impact on the overall parallel efficiency. The element merging does not affect the underlying FEM mesh discretization properties, it does however affect the FGaBP numerical complexity as a solver. Analysis by the inventors presented in Section E.2 shows that the overall computational complexity of the merged FEM-FG can be higher than that of the original, un-merged one. Nonetheless, the FGaBP demonstrates considerable speedups for the merged FEM-FG structure, because of better utilization of available memory bandwidth and cache resources resulting from improved computational locality.

Beneficially, the inventors have established that the merge feature can be used to control trade-offs between CPU resources such as memory bandwidth, cache utilization and CPU cycles, thus facilitate fine-tuned implementations on many core architecture.

C.3 Message Scheduling

Message communication in FGaBP can be performed subject to a particular schedule which can be sequential, parallel, or in any order. One of the key empirical observations of the FGaBP algorithm is the flexibility in message communication, which enables implementations that efficiently trade off computation with communication on various parallel architectures without compromising the numerical stability of the algorithm. However, message scheduling can considerably affect the convergence rate of the algorithm; therefore, a good message schedule exposes parallelism by exploiting the underlying connectivity structure of the problem.

There are two basic scheduling schemes for general BP messages, sequential (asynchronous) and parallel (synchronous). In sequential scheduling, all the FNs are sequentially traversed based on a particular order while their messages are communicated and synchronized one FN at a time. Each FN computes its messages based on the most recent nodal messages available within the iteration, which is $t_*=t$. This message schedule results in the least number of FGaBP iterations; but, it does not offer much parallelism. In parallel message scheduling, all the FN are processed in parallel while using the $\alpha_i$ and $\beta_i$ values computed at a previous iteration, $t_*=t-1$. An additional loop is needed to traverse all the VN s in parallel to compute new $\alpha_i$ and $\beta_i$ values from updated $\alpha_{ai}$ and $\beta_{ai}$. Such scheduling offers a high degree of parallelism; however, it requires considerably higher number of iterations due to slower information propagation. To address shared memory architectures, we propose an element-based coloring schedule that exploits parallelism inherent in the FEM-FG graphical model while not significantly increasing the number of FGaBP iterations.

Figure 8B:
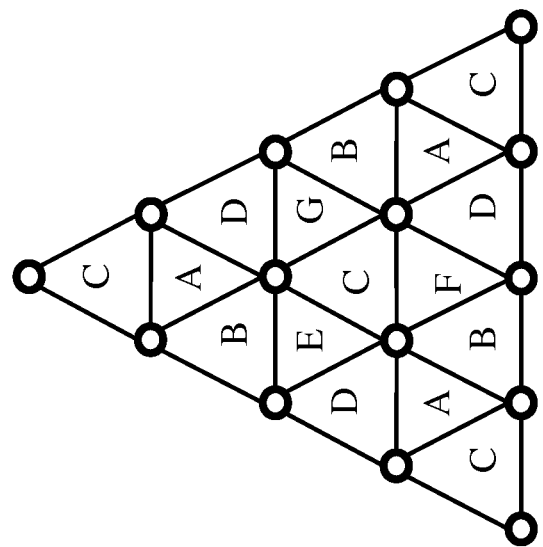
FIGS. 8A and 8B depict mesh element colouring within an FGaBP approach according to an embodiment of the invention for a structured quadrilateral mesh containing a total of four colors and a triangular mesh containing a total of six colors.
Figure 8A:
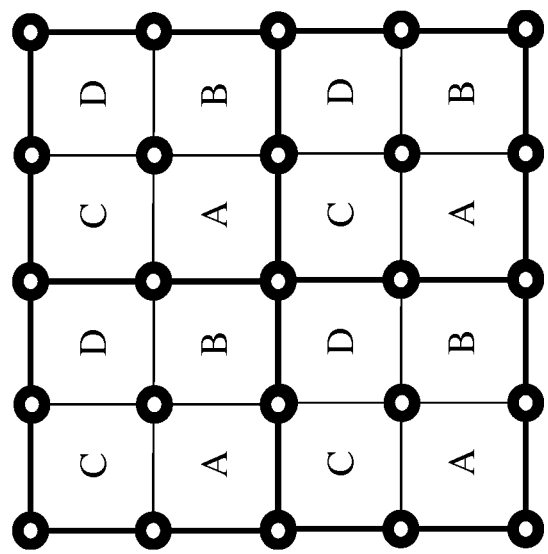

C.3.1 Color-Parallel Scheduling:

To implement a color-parallel message schedule (CPS), an element coloring algorithm needs to be used. The mesh elements are colored so that no two adjacent elements have the same color symbol. Elements are deemed adjacent if they share at least a node. A simple mesh coloring diagram is illustrated in FIG. 8 using two types of meshes, a quadrilateral mesh and a triangular mesh. FN messages in each color group are computed and communicated in parallel. To facilitate a CPS scheme, the FGaBP message updates are modified as defined by Equations (34) and (35). In other words, a running sum of the $\alpha_i$ and $\beta_i$ parameters are kept in each VN, initialized to zero at $t=1$, while differences on the FN edge messages are only communicated by FN processes. In this scheme, there is no need for an additional loop to traverse and synchronize the VN s.

The FN processes are synchronized before starting each color group. This scheme is particularly efficient for multi-threaded implementations on multicore CPUs or many core GPUs, since thread-safety is automatically guaranteed by the CPS. A typical coloring algorithm would aim to produce the least number of colors; since, this will reduce the number of thread synchronizations needed at the end of each color group. However, because FEM meshes contain a very large number of elements, producing a reasonable number of colors using a low complexity algorithm can be sufficient as long as each color contains a nearly balanced number of elements. The inventors analysis, presented below in Section E, indicate that the FMGaBP with CPS results in competitive iteration counts compared to PCG with both Geometric MG (GMG) and Algebraic MG (AMG) pre-conditioning.

D. Implementation Techniques

Within the preceding sections FGaBP, FMGaBP, and AU-FGaBP algorithms according to embodiments of the invention have been described and outlined for accelerating FEM simulations and analysis. Within this section implementation techniques for the implementation of the AU-FGaBP and FMGaBP algorithms on manycore and multi-core architectures using the CPS scheme are described.

D.1 Data-Structures

Using the CPS scheme in conjunction with the FGaBP algorithm and assuming all FN s are of the same type, then the overall storage requirement for the FGaBP is $O(2N+N_f(n^2+4n))$ in 64-bit words. This includes two vectors of size N for the VN s' $\alpha_i$ and $\beta_i$, and a data-structure of size $N_f$ containing the collection of FN data-structures where each FN data-structure contain a dense matrixes $M_a$, vectors $\beta_a$, $\alpha_{ai}$ and $\beta_{ai}$, and an integer vector storing local to global index associations.

Figure 13:
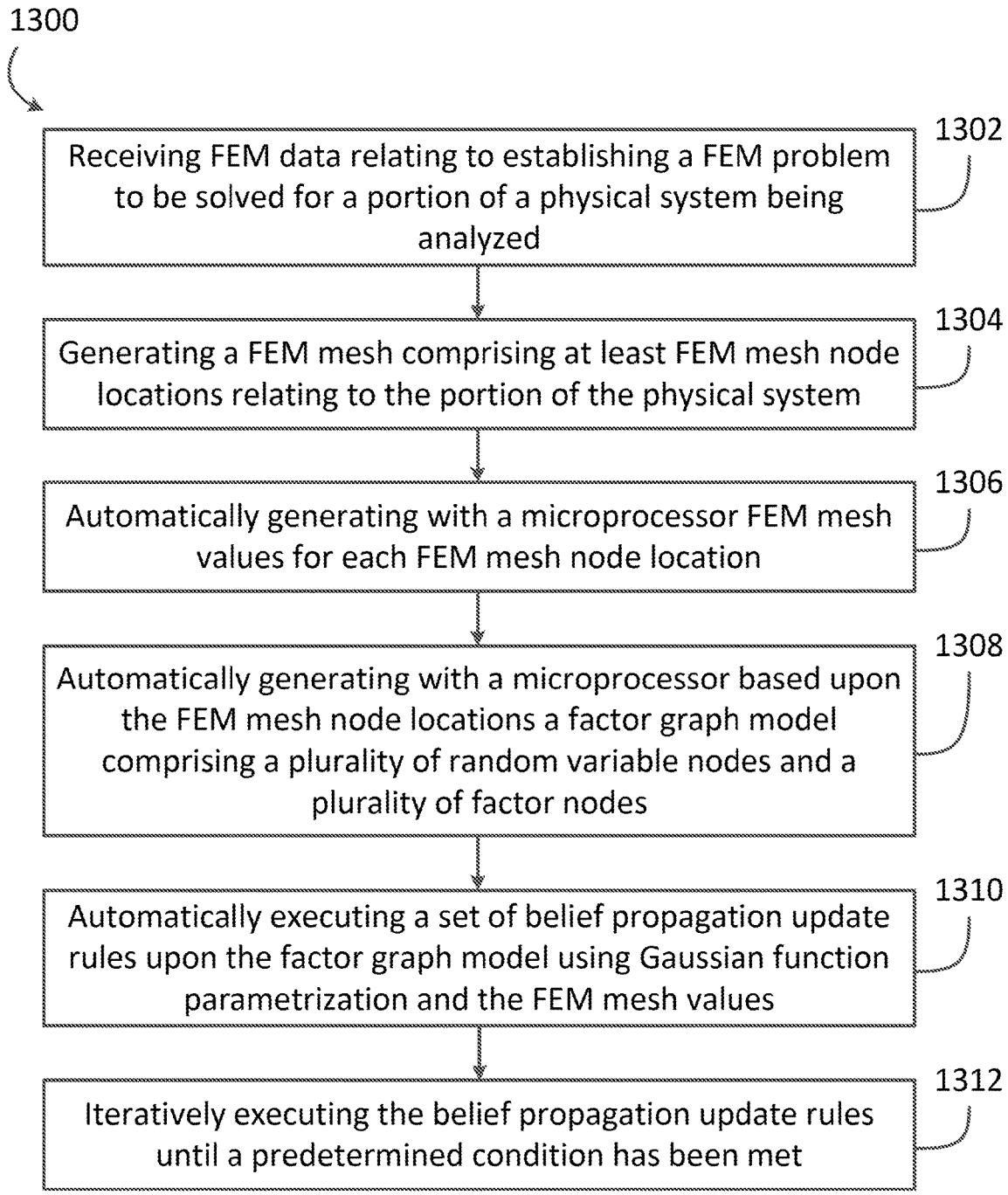
FIG. 13 depicts an example method of generating finite element modelling results.

With reference to FIG. 13, a particular implementation is illustrated as method 1300. At step 1302, FEM data relating to establishing a FEM problem to be solved for a portion of a physical system being analysed and comprising elements is received. The FEM data comprises physical dimensions of each element within the portion of the physical system, material data relating the materials forming each element within the portion of the physical system, and physical principles relating to the modelling being performed. At step 1304, a FEM mesh comprising at least FEM mesh node locations relating to the portion of the physical system is generated in dependence upon at least the physical dimensions of each element within the portion of the physical system. At step 1306, FEM mesh values for each FEM mesh node location are automatically generated with a microprocessor, the FEM mesh value established in dependence upon FEM mesh node location within the portion of the physical system, the material data and physical principles. At step 1308, based upon the FEM mesh node locations, a factor graph model is automatically generated with a microprocessor, the factor graph model comprising a plurality of random variable nodes and a plurality of factor nodes. At step 1310, a set of belief propagation update rules are automatically executed upon the factor graph model using Gaussian function parametrization and the FEM mesh values, the belief propagation update rules comprising a factor node update rule that a factor node message is sent from each factor node of the plurality of factor nodes to all variable nodes of the plurality of variable nodes to which it is connected and a variable node update rule that a variable node message is sent back from a variable node to each factor node of the plurality of factor nodes to which it is connected. At step 1312, the belief propagation update rules are iteratively executed until a predetermined condition has been met.

Also, this setup assumes that all indexes are stored in 64-bit integers and all real numbers are stored in 64-bit double-precision floating-points, which is essential for very large problems. Since usually $O(N_f) \approx O(N)$, the overall FGaBP memory complexity is $O(N)$, typical for sparse problems. However, unlike conventional sparse data-structures such as the compressed row storage (CRS), all the FGaBP data is dense. Hence, the FGaBP data-structure adds minimal overhead by eliminating the need to store complicated sparsity patterns. More importantly, iterative solvers in comparison, such as the PCG, require considerable memory not only to store the sparse matrix, but also the preconditioner.

The FMGaBP data-structures are mostly based on the FGaBP data-structures with the addition of another dense matrix per multigrid level. The added matrix stores the index associations of parent-child FNs for each hierarchical pair of coarse-fine levels. The total size of the FMGaBP memory can be obtained from Equations (36) and (37) where l is the level index; L is the total number of levels; $Z=2N+N_f(n^2+4n)$ which is the FGaBP memory on the finest level; and c is the number of children, e.g. c=4 for 2D quadrilateral meshes or c=8 for 3D hexahedral meshes. Clearly, the overall memory complexity is linear in N as $L \to \infty$.

D.2 Multicore CPU Implementation:

Both the FGaBP and FMGaBP were programmed using C++ Object Oriented Programming (OOP) and parallelized on multicore processors using OpenMP which supports multi-platform shared memory multiprocessing programming in several languages including C++.

D.3 Many-Core Graphics Processing Unit (GPU) Implementation:

Within the past decade, processing architectures with many (tens or hundreds of) integrated cores have been introduced and used in the scientific computing community. GPUs are a popular class of many-core processors offering greater opportunities of parallelism on a single chip than multicore CPUs. It is expected that adeptly parallel algorithms such as the FMGaBP would benefit from the increased parallelism of GPU architectures. Accordingly, in this section the inventors detail implementation techniques for FMGaBP performance evaluation on GPU architectures.

D.3.1 The GPU Architecture:

The NVIDIA Tesla C2075 GPU is used to illustrate the performance of the FMGaBP implementation on manycore architectures. The Tesla C2075 has a 6 GB DRAM, 448 Compute Unified Device Architecture (CUDA) cores, 48 KB of shared memory, and a memory bandwidth of 144 GB/s. Current NVIDIA GPUs consist of streaming multiprocessors (SMs) each containing a few scalar processor cores (SPs), an on-chip shared memory, a data cache and a register file. Threads executing on each SM have access to the same shared memory and register file, which enables communication and data synchronization with little overhead. Threads executing on different SMs can only synchronize through the GPU off-chip global DRAM which incurs high latency of several hundred clock cycles. To parallelize an algorithm on GPUs, all of these architectural features have to be taken into account to efficiently use the available GPU resources.

The most popular APIs used to implement algorithms on GPUs are the Compute Unified Device Architecture (CUDA) and the Open Computing Language (OpenCL). CUDA 5.0 was used along with the library CUBLAS 5.0 [57] to implement the FMGaBP algorithm on the GPU. Initially, data has to be explicitly transferred from the CPU memory to GPU and a then a collection of kernels are instantiated from the CPU to execute the parallel segments of the program on the GPU. Threads are grouped into blocks that are scheduled for execution on the GPU's SM. Groups of 32 threads in a block, called warps, are scheduled to execute the same instruction at the same time. Threads in the same block can communicate via onchip shared memory with little latency while threads in different blocks have to go through GPU global memory for any kind of data synchronization [57].

D.3.2 GPU Implementation Details:

The FN s, VN s, and level matrix data are transferred to the GPU once and hence no GPU-CPU memory transfers are required during the algorithm's execution. The following details the GPU implementation of FMGaBP.

D.3.2.A Multigrid Restrict and Prolong Kernels:

The restriction and prolongation stages are implemented in two different kernels. The parent-child mapping in the FMGaBP are loaded into shared memory to reduce global memory references. The most computationally intensive operation within the multigrid computations is the dense matrix vector multiply for each parent FN in the coarser grid. The number of parent nodes assigned to each warp is computed by dividing the number of threads per warp (32) by the number of children for each parent. For example, in a 2D problem using quadrilateral meshes, each warp in the interpolation kernel applies corrections from eight FNs in the coarse grid to their children; thus allocating four threads to each FN in the coarse grid to parallelize the compute intensive kernels involved in the restrict operations.

D.3.2.B Batch of Inverses on GPUs:

Computing the inverse of local matrices in the smoother iterations is the most time consuming operation in the FGaBP algorithm. Depending on the problem size, the number of matrices to be inverted can be very large. Various heuristics could be used to compute a batch of inverses on the GPU. Depending on the size of the local matrices, each inverse could be computed via one thread block, one warp or even one thread. For example, if the rank of each matrix is 256 then allocating one thread block (with 256 threads) to each matrix inverse would be efficient.

A batch of inverses can be computed using the NVIDIA CUBLAS library for matrices up to rank 32. An in-place LU decomposition should first be performed and then the cublasDgetriBatched kernel is called to compute an out-of-place batch inversion. Since each warp computes the inverse of one matrix, the aforementioned kernel does not perform well for the low rank matrices in the FMGaBP kernel. For 2D problems using quadrilateral meshes or 3D problems using tetrahedral meshes, our matrices are only of rank 4, thus when using the CUBLAS matrix inversion, the GPU resource will be underutilized and threads in a warp will not have enough work. Our matrix inversion kernel is customized to the matrix's dimension. The number of inverses computed via one warp is obtained through dividing the number of threads per warp (32) by the rank of the local dense matrices. For example, for a 2D problem with rank 4 local matrices, each warp computes 8 matrix inversions. The implementations according to embodiments of the invention outperform the CUBLAS matrix inversion kernel by 2× when inverting a batch of 10 million rank 4 matrices. Another major advantage of our matrix inverse kernel is that it performs the inverse in-place on shared memory. As a result, the computed inverses do not have to be stored in global memory and the outgoing messages can be computed in the same kernel. Not storing the matrix inverses in the global memory enables the GPU to solve larger problems more readily.

D.3.2.0 Kernel Fusion in FGaBP:

The FGaBP iterations involve computing the incoming and outgoing messages and updating the VN's running sums. Instead of calling three separate GPU kernels one for each stage, the process according to embodiments of the invention fuse these kernels and only call one GPU kernel for each iteration. Key advantages resulting from the fusion process are, firstly, data can be loaded completely into shared memory in order to be used by a single FGaBP kernel call reducing communication within the GPU's memory hierarchy. Second, the local matrix inverses can be generated on the fly and used to compute the running sum without the need to be stored in global memory. Lastly, kernel call overheads are also reduced by only calling one kernel for each FGaBP iteration.

E. Results and Discussions

Within this section, the inventors present numerical and performance results for the FGaBP and FMGaBP algorithms according to embodiments of the invention. The definite Helmholtz problem was first used to verify the numerical results of the AU-FGaBP algorithm. Then, the performance results of the enhanced FMGaBP algorithm on multicore and many-core architectures were assessed. In all experiments, unless otherwise stated, the iterations are terminated when the relative message error $l^2$-norm drops below $10^{-12}$ on the finest level.

D.1 FGaBP Verification

The OOP based design of the FGaBP software facilitates its integration with existing frameworks of open-source software such as deal.II and GetFEM++. The basic FGaBP formulation was previously demonstrated by the inventors in "Parallel Solution of the Finite Element Method using Gaussian Belief Propagation" ($15^{th}$ IEEE Conf. Electromagnetic Field Computation, pp. 141) and "Parallel Multigrid Acceleration for the Finite Element Gaussian Belief Propagation Algorithm" (IEEE Trans. Magn., Vol. 50, No. 2, pp. 581-584) for 2D Laplace problems using both triangular and quadrilateral FEM elements as provided by the libraries GetFEM++ and deal.II respectively. Within the inventor's work the numerical results of the new AU-FGaBP formulation are verified using the definite Helmoltz problem with a known solution for 2D and 3D domains as well as higher order FEM elements. The Helmholtz problem setup is provided by deal.II. The definite Helmholtz is formulated by Equations (38) to (40) respectively where δD and δM are the Dirichlet and Neumann boundaries such that $\delta D \cup \delta N = \delta \Omega$, and Ω is the square or cubic domain bounded by [-1,1]. Equation (40) constitutes the non-homogeneous Neumann boundary condition.

$$-\nabla \cdot \nabla u + u = g_1; \text{ on } \Omega \quad (38)$$

$$u = f_1; \text{ on } \delta D \quad (39)$$

$$n \cdot \nabla u = f_2; \text{ on } \delta N \quad (40)$$

The right-hand-side functions are set, such that the exact solution is given by Equation (41) where p is a spatial variable in (x,y,z), $p_i$ are exponential center points chosen arbitrarily, and σ=0.125. The library deal.II creates the mesh, and provides the FGaBP class with the elements' M, B, and local to global index data. The AU-FGaBP processes the FEM problem element-by-element in parallel to compute the solution. Afterwards, functions from the library deal.II are used to compute the final error relative to the exact solution of the Helmhotlz problem on each individual element.

$$u(p) = \sum_i^3 \exp\left(-\frac{|p - p_i|^2}{\sigma^2}\right) \quad (41)$$

Figure 9:
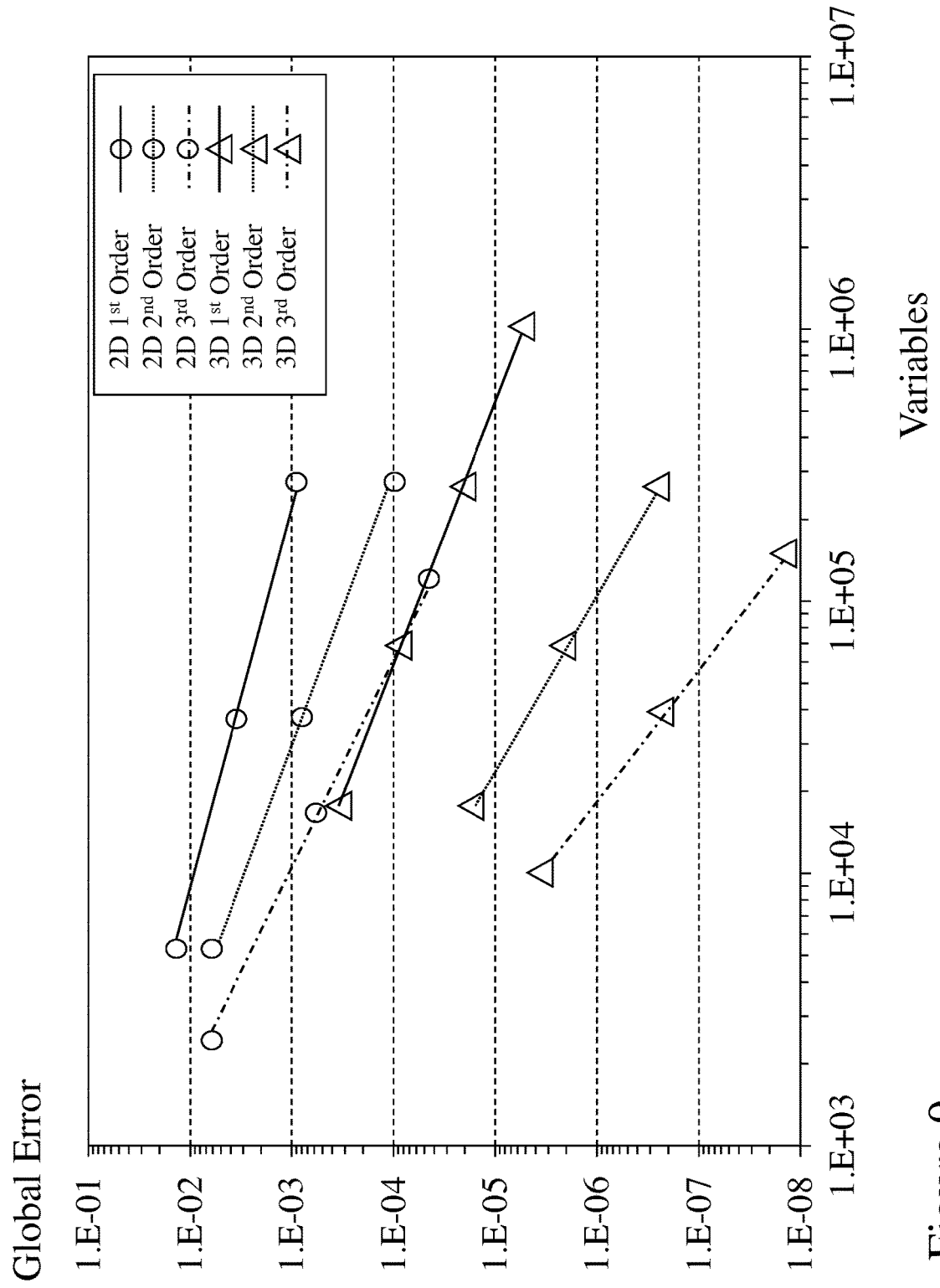
FIG. 9 depicts the global error of the Approximate Update (AU-FGaBP) according to an embodiment of the invention obtained from element-based $l^2$-norm error relative to the exact solution versus the number of variables.

The AU-FGaBP uses α message tolerance of $10^{-1}$ and two GS iterations. The test cases are obtained by varying the FEM element order from the 1st to the 3rd order for both 2D quadrilaterals and 3D hexahedrals. FIG. 9 shows the global error plots for each test case. The global error plots are obtained by summing up the squares of the $l^2$-norm of the error on each element and then taking the square root of the result. As shown the AU-FGaBP obtains the expected error trends for the FEM; accuracy increases on all test cases with increasing number of elements as well as increasing FEM order.

D.2 Element Merging Performance

Element merging in the FGaBP algorithm is demonstrated using a structured triangular mesh on a unit square domain. The Laplace equation is solved in the domain using zero Dirichlet on the boundary. The unit square is subdivided into equally spaced sub-squares where each square is further divided into two right triangles. We perform two level merges by merging each two adjacent triangles, and then each four adjacent triangles. The original mesh has $N_f$=200,000 triangular element FN. Relaxation was not used in order to isolate the effect of merging on performance and iterations. The algorithm iterations where terminated when the message relative error $l^2$-norm reached less than $10^{-9}$. Table 5 shows the speedup results from merging. The experiments were performed on an Intel Core2 Quad CPU with clock frequency of 2.83 GHz.

TABLE 5

AU-FGaBP with Element Merge Speedups

| Merge | $N_f$ | LDOF | Iteration Ratio (1) | Complexity Ratio (2) | Speedup |
|---|---|---|---|---|---|
| Un-merged | 200,000 | 3 | 1.0 | 1.0 | 1.0 |
| 2-Triangle | 100,000 | 4 | 1.08 | 0.972 | 1.34 |
| 4-Triangle | 50,000 | 6 | 1.35 | 0.771 | 2.89 |

Note
(1) Iterations Ratio = Iterations of Un-Merged/Merged
(2) Complexity Ratio = Complexity of Un-Merged/Merged The merge results in increasing speedups. The results illustrates that the execution time improves with increased merging which was mainly due to the improved locality of the algorithm. The complexity of the merged algorithms can approximately be stated as $O(TN_f(n^3+n^2))$ where T is the total number of iterations. The results also show reductions in iterations with increased merging, whereas the computational complexity increases due to increased local complexities in the factor nodes. These reductions in iterations may be attributed to the better numerical properties of the merged algorithms by correlating more local information in each factor belief. However the improved locality of the merge algorithms predominate the increase in overall complexity resulting in higher speedups. Mainly, improved locality results in better trade-offs of cache and memory bandwidth for cheaper CPU flops. Nonetheless, increased merging is expected to result in reduced performance; however, such high merge configurations would not be practical in most FEM problems.

E.3 Multicore Performance

Figure 10:
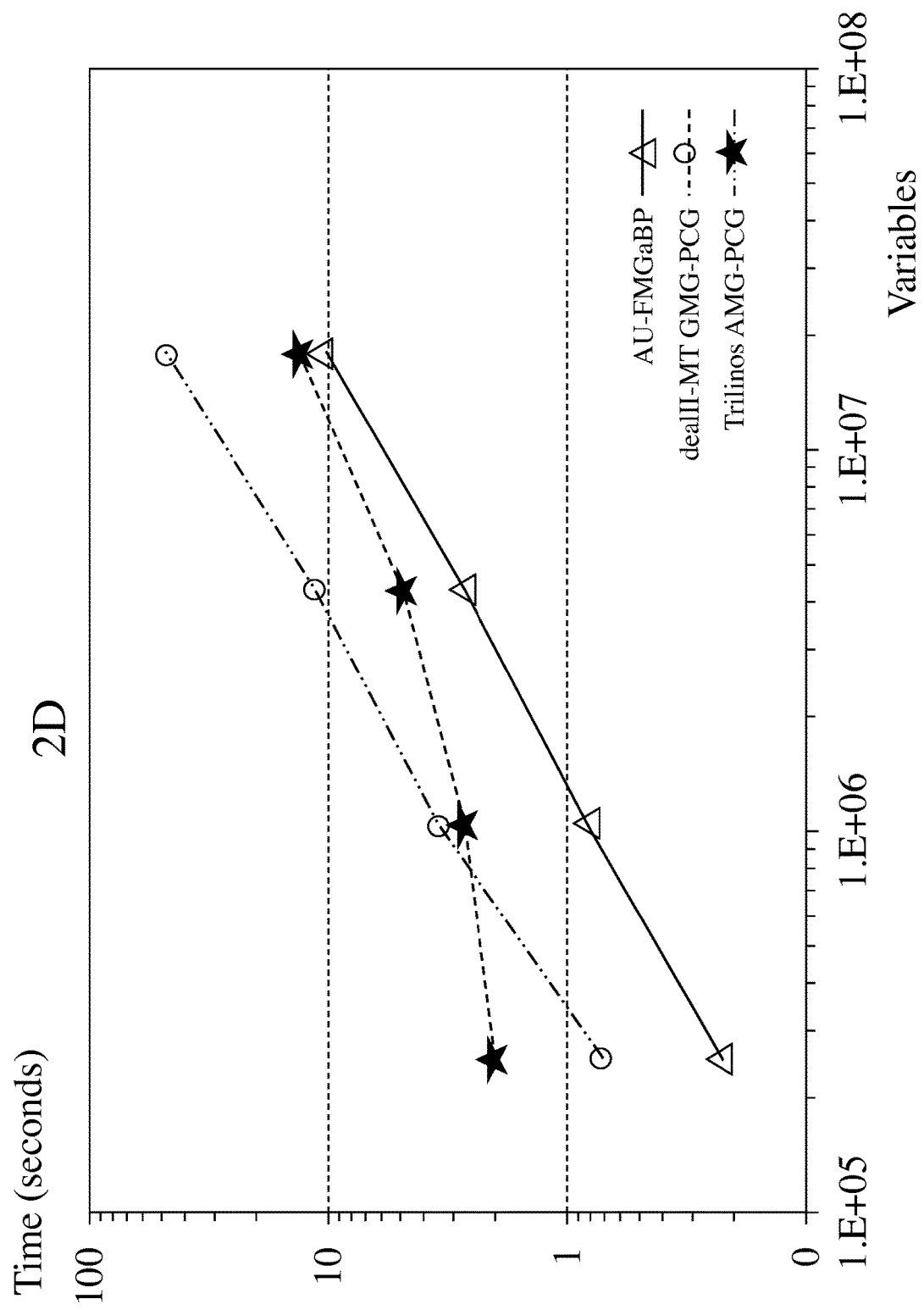
FIG. 10 depicts the 2D execution time for a FGaBP algorithm according to an embodiment of the invention on a 16-core node versus the number of variables.
Figure 11:
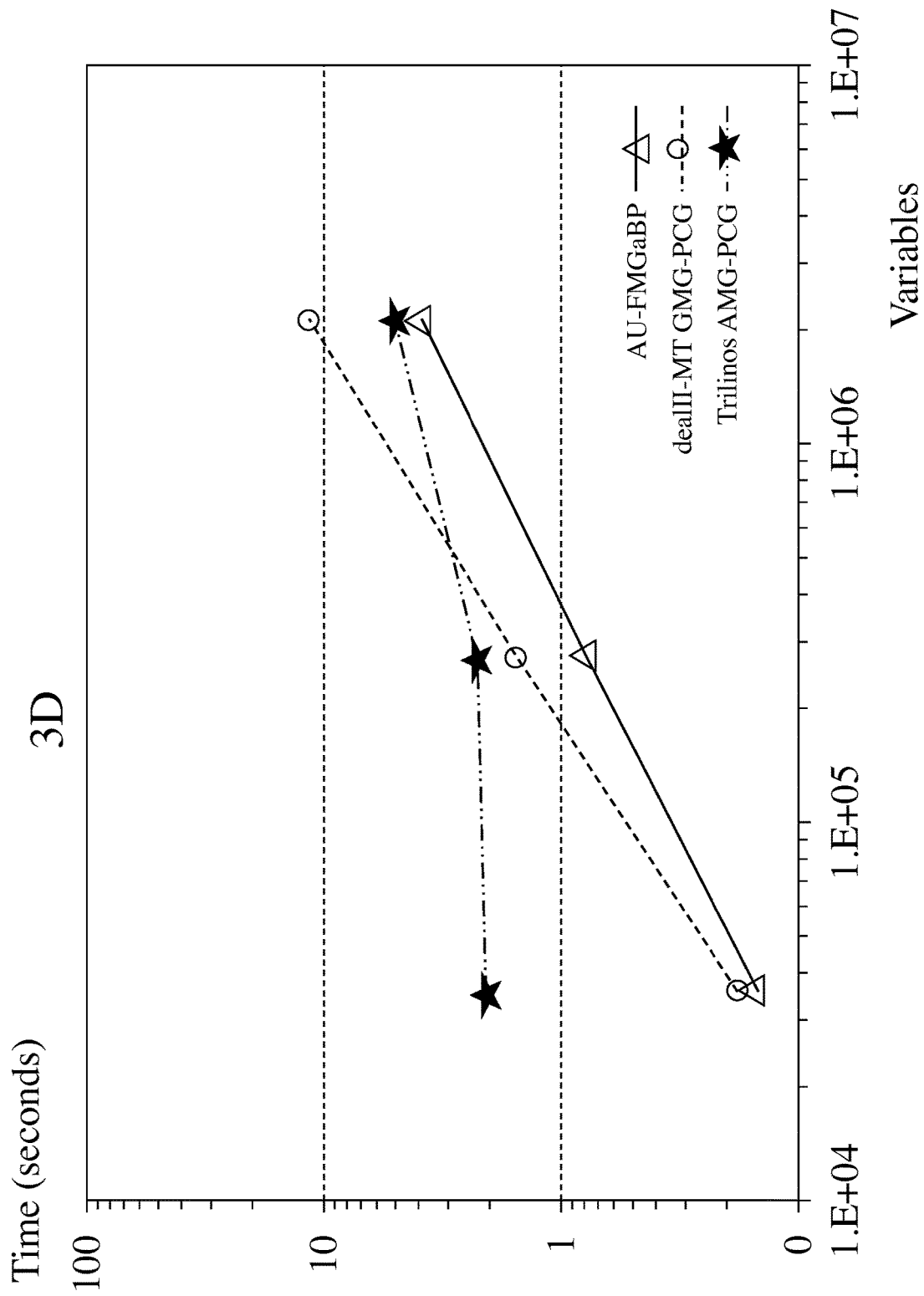
FIG. 11 depicts the 3D execution time for a FGaBP algorithm according to an embodiment of the invention on a 16-core node versus the number of variables.

The inventors compared their multicore implementation to two optimized parallel open-source implementations, these being deal.II-MT (Multithreaded) and Trilinos. The execution time for all runs were obtained on a SciNet Sandybride cluster node which contains 2×8-core Xeon 2.0 GHz CPUs with 64 GB DRAM. The implementation from deal.II uses geometric MG (GMG) as a pre-conditioner with multithreaded parallelism, while the implementation from Trilinos uses Algebraic MG (AMG) as a pre-conditioner with MPI parallelism. As the intention is to show the efficiency of the parallel computations of the FEM solvers, the inventors have used simple domains with well balanced partitions. The AU-FMGaBP required 6 iterations for all 2D level runs; and 8 iterations for all 3D level runs. This illustrates that the FMGaBP, typical of multigrid schemes, results in optimal convergence. deal.II implementations show similar iterations results. Trilinos execution resulted in up to 14 iterations for 2D and 16 iterations for 3D since AMG typically requires more iterations than GMG. The AU-FMGaBP algorithm was used with the CPS scheme. FIGS. 10 and 11 show the execution results for all implementations parallelized on 16-cores. Problem sizes ranging from 35K to 16.7M unknowns were used. The AU-FMGaBP demonstrated faster execution time in all runs while showing linear scalability with the number of unknowns. As the problem size increases, the overhead due to Trilinos's MPI calls reduces resulting in improved efficiency for larger problems. In contrast, the AU-FMGaBP demonstrated higher efficiency for all problem sizes. The single node ran out of memory for larger problems. However these results indicate that to efficiently address larger problems, the AU-FMGaBP needs to employ hybrid parallelism with multithreading and MPI on multiple nodes. Such implementation requires specialized message scheduling algorithms and mesh partitioning schemes which support the element merging features. This implementation is planned for future work.

E.4 Many-Core Performance

Figure 12:
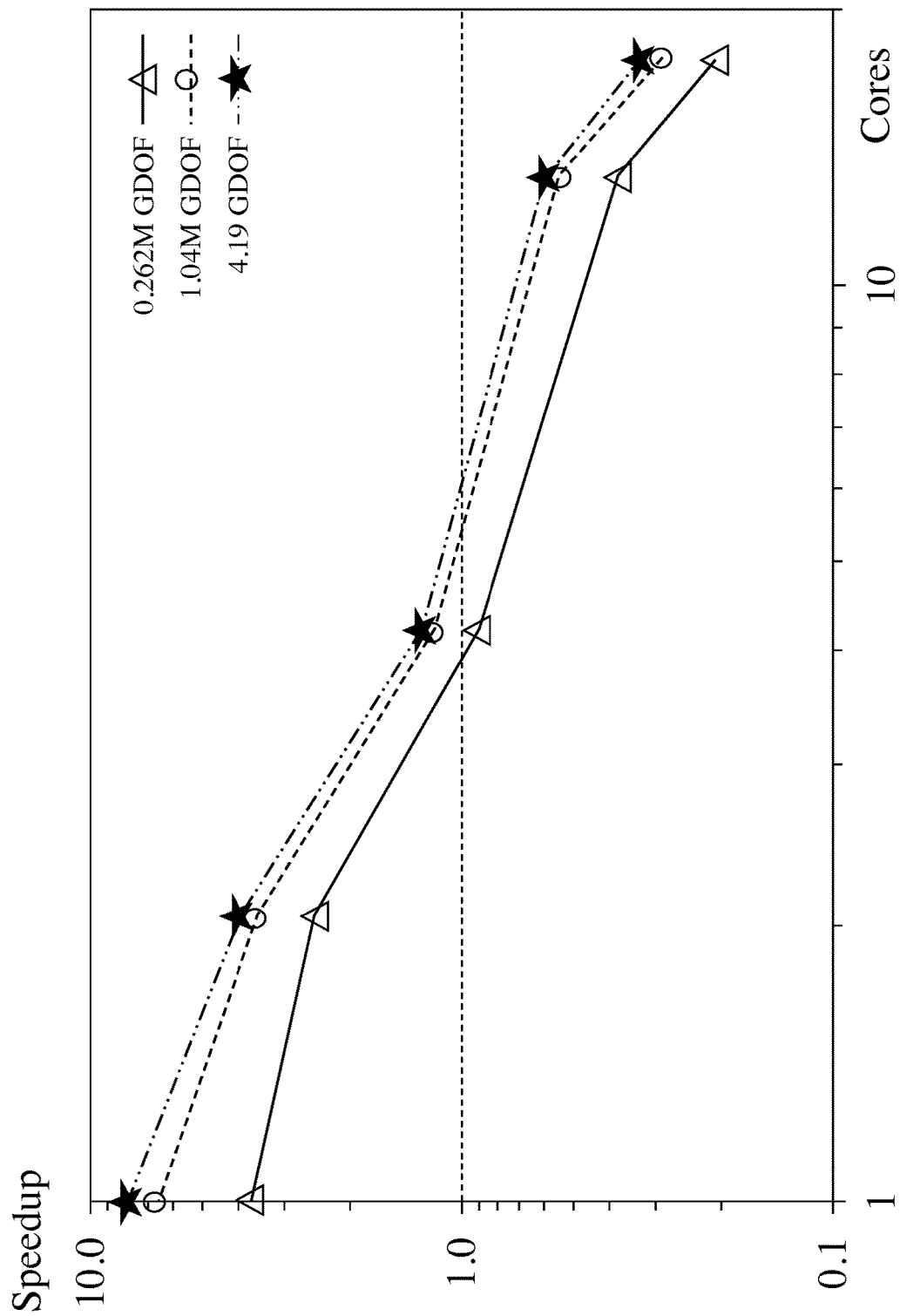
FIG. 12 depicts the speedup achieved from accelerating FMGaBP on a NVIDIA Tesla C2075 compared to the parallel implementation of the method on 1-16 CPU cores.

The FMGaBP is implemented on NVIDIA Tesla C2075 for the 2D Helmholtz problem with number of unknowns ranging from 26K to 4.1M. Larger problems should be executed on a cluster of GPUs because of the GPU global memory size limits. FIG. 12 shows the speedup achieved by implementing FMGaBP on a single GPU versus the proposed parallel CPU implementation of the method on the SciNet 2×8-core Xeon processor. The speedup scalability is also presented in the figure by altering the number of threads for the CPU runs. As shown in the figure, the Tesla C2075 outperforms the CPU with up to 12 cores for all problem sizes.

Larger problems are able to utilize the GPU resources more efficiently thus the GPU is faster than the 16-core CPU node for the largest problem with 4.1M unknowns. The only case where the GPU did not demonstrate speedups were for the smaller problem sizes (26K and 1M unknowns). The average (speedup over all problem sizes) achieved from the GPU implementation compared to the dual-core, quad-core and 12-core CPU settings are 4.8×, 2.3× and 1.5× respectively.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory content. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of generating finite element modelling results comprising:

receiving finite element method (FEM) data relating to establishing a problem to be solved for a portion of a physical system being analyzed and comprising elements, the FEM data comprising physical dimensions of each element within the portion of the physical system, material data relating the materials forming, each element within the portion of the physical system, and physical principles relating to the modelling being performed;

generating a FEM mesh comprising at least FEM mesh node locations relating to the portion of the physical system in dependence upon at least the physical dimensions of each element within the portion of the physical system;

automatically generating, with a microprocessor FEM mesh values for each FEM mesh node location, the FEM mesh value established in dependence upon FEM mesh node location within the portion of the physical system, the material data and physical principles, automatically generating with a microprocessor based upon the FEM mesh node locations a factor graph model, the factor graph model comprising a plurality of random variable nodes and a plurality of factor nodes, wherein at least some of the factor nodes are connected to at least three of the plurality of random variable nodes;

automatically executing a set of belief propagation update rules upon the factor graph model using Gaussian function parametrization and the FEM mesh values, the belief propagation update rules comprising a factor node update rule that a factor node message is sent from each factor node of the plurality of factor nodes to all variable nodes of the plurality of variable nodes to which it is connected and a variable node update rule that a variable node message is sent hack from a variable node to each factor node of the plurality of factor nodes to which it is connected;

iteratively executing the belief propagation update rules until a predetermined condition has been met;

wherein the factor node messaging and variable node messaging comprises a sequence of performing all factor node updates followed by the variable node messaging updates wherein the variable node messaging updates are performed in parallel based on a colour parallel messaging schedule; and wherein the colour parallel messaging schedule exploits an element coloring algorithm such that no two adjacent elements have the same colour symbol and different colour elements are updated in parallel.

2. The method according to claim 1, wherein the predetermined condition is that an energy function defined for the FEM model is at least one of minimized or is reduced to below a threshold value.

3. The method according to claim 1, wherein establishing the FEM mesh comprises establishing multiple grids with hierarchal refinement by splitting a parent element of predetermined geometry into a predetermined number of child elements with the predetermined geometry and using a consistent node numbering between each set of parent-child elements; and executing the set of belief propagation update rules comprises locally restricting belief residuals arising from the belief propagation within each group of child elements to the parent element.

4. The method according to claim 3, wherein the consistent node numbering between each parent-child set of elements is generic.

5. The method according to claim 3, wherein the belief propagation update rules are applied to each grid of the multiple grids using the locally restricted belief residuals from the grid below the grid for which beliefs are being propagated.

6. The method according to claim 1, wherein the factor node update rule is reformulated using a partitioned matrix inversion such that a number of iterations of factor node updates are performed prior to executing a variable node update.

7. The method according to claim 1, wherein
at least one of:
elements within the mesh sharing edges in a 2D mesh are merged; and
elements sharing surfaces within a 3D mesh are merged.

8. The method according to claim 1, wherein
elements within the mesh sharing edges in a 2D mesh are merged; and
the number of elements merged is limited on the basis that the elements form a connected region within the mesh.

9. A non-transitory computer-readable medium encoded with instructions for generating finite element modelling results, the instructions when executed by a microprocessor comprising:
receiving finite element method (FEM) data relating to establishing a FEM problem to be solved for a portion of a physical system being analyzed and comprising elements, the FEM data comprising physical dimensions of each element within the portion of the physical system, material data relating the materials forming eachelement within the portion of the physical system, and physical principles relating to the modelling being performed;
generating a FEM mesh comprising at least FEM mesh node locations relating to the portion of the physical system in dependence upon at least the physical dimensions of each element within the portion of the physical system;
automatically generating with a microprocessor FEM mesh values for each FEM mesh node location, the FEM mesh value established in dependence upon FEM mesh node location within the portion of the physical system, the material data and physical principles;
automatically generating with a microprocessor based upon the FEM mesh node locations a factor graph model, the factor graph model comprising a plurality of random variable nodes and a plurality of factor nodes, wherein at least some of the factor nodes are connected to at least three of the plurality of random variable nodes;
automatically executing a set of belief propagation update rules upon the factor graph model using Gaussian function parametrization and the FEM mesh values, the belief propagation update rules comprising a factor node update rule that a factor node message is sent from each factor node of the plurality of factor nodes to a l variable nodes of the plurality of variable nodes to which it is connected and a variable node update rule that a variable node message is sent back from a variable node to each factor node of the plurality of factor nodes to which it is connected;
iteratively executing the belief propagation update rules until a predetermined condition has been met;
wherein the factor node messaging and variable node messaging comprises a sequence of performing all factor node updates followed by the variable node messaging updates wherein the variable node messaging updates are performed in parallel based on a colour parallel messaging schedule; and
wherein the colour parallel messaging schedule exploits an element coloring algorithm such that no two adjacent elements have the same colour symbol and different colour elements are updated in parallel.

10. The non-transitory computer-readable medium according to claim 9, wherein
the predetermined condition is that an energy function defined for the FEM model is at least one of minimized or is reduced to below a threshold value.

11. The non-transitory computer-readable medium according to claim 9, wherein
establishing the FEM mesh comprises establishing multiple grids with hierarchal refinement by splitting a parent element of predetermined geometry into a predetermined number of child elements with the predetermined geometry and using a consistent node numbering between each set of parent-child elements; and
executing the set of belief propagation update rules comprises locally restricting belief residuals arising from the belief propagation within each group of child elements to the parent element.

12. The non-transitory computer-readable medium according to claim 11, wherein
the consistent node numbering between each parent-child set of elements is generic.

13. The non-transitory computer-readable medium according to claim 11, wherein
the belief propagation update rules are applied to each grid of the multiple grids using the locally restricted belief residuals from the grid below the grid for which beliefs are being propagated.

14. The non-transitory computer-readable medium according to claim 9, wherein
the factor node update rule is reformulated using a partitioned matrix inversion such that a number of iterations of factor node updates are performed prior to executing a variable node update.

15. The non-transitory computer-readable medium according to claim 9, wherein
at least one of:
elements within the mesh sharing edges in a 2D mesh are merged; and
elements sharing surfaces within a 3D mesh are merged.

16. The non-transitory computer-readable medium according to claim 9, wherein
elements within the mesh sharing edges in a 2D mesh are merged; and
the number of elements merged is limited on the basis that the elements form a connected region within the mesh.

* * * * *